(12) United States Patent
Park et al.

(10) Patent No.: US 10,529,727 B2
(45) Date of Patent: Jan. 7, 2020

(54) NONVOLATILE MEMORY DEVICE COMPENSATING FOR VOLTAGE DROP OF TARGET GATE LINE

(71) Applicant: SAMSUNG ELECTRONICS CO., LTD., Suwon-si, Gyeonggi-do (KR)

(72) Inventors: June-Hong Park, Seongnam-si (KR); Bong-Soon Lim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/165,237

(22) Filed: Oct. 19, 2018

(65) Prior Publication Data

US 2019/0198513 A1      Jun. 27, 2019

(30) Foreign Application Priority Data

Dec. 27, 2017 (KR) .................. 10-2017-0181344

(51) Int. Cl.
| | |
|---|---|
| G11C 5/14 | (2006.01) |
| H01L 27/11529 | (2017.01) |
| G11C 16/08 | (2006.01) |
| H01L 27/11519 | (2017.01) |
| H01L 27/11565 | (2017.01) |
| H01L 27/1157 | (2017.01) |
| H01L 27/11556 | (2017.01) |
| H01L 27/11582 | (2017.01) |
| H01L 27/11573 | (2017.01) |
| H01L 27/11524 | (2017.01) |
| G11C 16/04 | (2006.01) |

(52) U.S. Cl.
CPC ........ *H01L 27/11529* (2013.01); *G11C 16/08* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11573* (2013.01); *H01L 27/11582* (2013.01); *G11C 16/0483* (2013.01)

(58) Field of Classification Search
CPC ........ G11C 16/08; G11C 5/14; G11C 11/0038
USPC .............................. 365/222, 185.13, 185.17
See application file for complete search history.

(56) References Cited

U.S. PATENT DOCUMENTS

| | | | |
|---|---|---|---|
| 7,910,432 | B2 | 3/2011 | Tanaka et al. |
| 8,324,680 | B2 | 12/2012 | Izumi et al. |
| 8,338,882 | B2 | 12/2012 | Tanaka et al. |
| 8,917,551 | B2 | 12/2014 | Lee et al. |

(Continued)

*Primary Examiner* — Han Yang
(74) *Attorney, Agent, or Firm* — F. Chau & Associates, LLC

(57) ABSTRACT

A nonvolatile memory device includes a plurality of gate lines extending in a first direction and stacked in a second direction to form a memory block, where the second direction is perpendicular to the first direction, an address decoder disposed at a first side of the plurality of gate lines to drive the plurality of gate lines, a voltage compensation line extending in the first direction substantially in parallel with the plurality of gate lines, and overlapping with a target gate line among the plurality of gate lines in the second direction, a rising vertical contact extending in the second direction to connect the address decoder and a first portion of the voltage compensation line, and conduction paths connecting in the second direction the first and second portions of the voltage compensation line with near and far end portions of the target gate line.

20 Claims, 21 Drawing Sheets

(56) References Cited

U.S. PATENT DOCUMENTS

| | | |
|---|---|---|
| 8,951,859 B2 | 2/2015 | Higashitani et al. |
| 9,018,047 B2 | 4/2015 | Lue |
| 9,070,621 B2 | 6/2015 | Sasago et al. |
| 9,431,415 B2 | 8/2016 | Shin et al. |
| 9,515,087 B2 | 12/2016 | Son et al. |
| 9,548,316 B2 | 1/2017 | Lim et al. |
| 9,666,289 B2 | 5/2017 | Lee et al. |
| 2017/0110185 A1* | 4/2017 | Hahn ................. G11C 11/5628 |

* cited by examiner

NONVOLATILE MEMORY DEVICE COMPENSATING FOR VOLTAGE DROP OF TARGET GATE LINE

CROSS-REFERENCE TO RELATED APPLICATION

This U.S. non-provisional application claims priority under 35 U.S.C. § 119 to Korean Patent Application No. 10-2017-0181344, filed on Dec. 27, 2017 in the Korean Intellectual Property Office (KIPO), the disclosure of which is incorporated by reference herein in its entirety.

TECHNICAL FIELD

Exemplary embodiments of the inventive concept relate generally to semiconductor integrated circuits, and more particularly, to a nonvolatile memory device compensating for voltage drop of a target gate line.

DISCUSSION OF RELATED ART

Nonvolatile memory devices may maintain stored data even though power is off. While volatile memory devices are widely used as main memories of various apparatuses, nonvolatile memory devices are widely used for storing program codes and/or data in various electronic devices, such as computers, mobile devices, etc. Recently, nonvolatile memory devices having a three-dimensional structure, such as a vertical NAND memory device, have been developed to increase integration degree and memory capacity. Due to the increase in integration degree and memory capacity, a load of a signal line may be increased and operation speed of the nonvolatile memory device may be decreased.

SUMMARY

According to an exemplary embodiment of the inventive concept, a nonvolatile memory device includes a plurality of gate lines extending in a first direction and stacked in a second direction to form a memory block, where the second direction is perpendicular to the first direction, an address decoder disposed at a first side of the plurality of gate lines to drive the plurality of gate lines, a voltage compensation line extending in the first direction substantially in parallel with the plurality of gate lines, and overlapping with a target gate line among the plurality of gate lines in the second direction, a rising vertical contact extending in the second direction to connect the address decoder and a first portion of the voltage compensation line, a near conduction path connecting in the second direction the first portion of the voltage compensation line and a near end portion of the target gate line, and a far conduction path connecting in the second direction a second portion of the voltage compensation line and a far end portion of the target gate line.

According to an exemplary embodiment of the inventive concept, a nonvolatile memory device includes a plurality of gate lines extending in a first direction and stacked in a second direction to form a memory block, where the second direction is perpendicular to the first direction, a voltage compensation line to compensate for a driving voltage applied to a target gate line among the plurality of gate lines, and a plurality of conduction paths connecting the voltage compensation line and end portions of the target gate line in the second direction.

According to an exemplary embodiment of the inventive concept, a nonvolatile memory device includes a plurality of gate lines extending in a first direction and stacked in a second direction to form a memory block, where the second direction is perpendicular to the first direction, a first voltage compensation line to compensate for a driving voltage applied to a first target gate line among the plurality of gate lines, a second voltage compensation line to compensate for a driving voltage applied to a second target gate line among the plurality of gate lines, a plurality of first conduction paths connecting the first voltage compensation line and end portions of the first target gate line in the second direction, and a plurality of second conduction paths connecting the second voltage compensation line and end portions of the second target gate line in the second direction.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
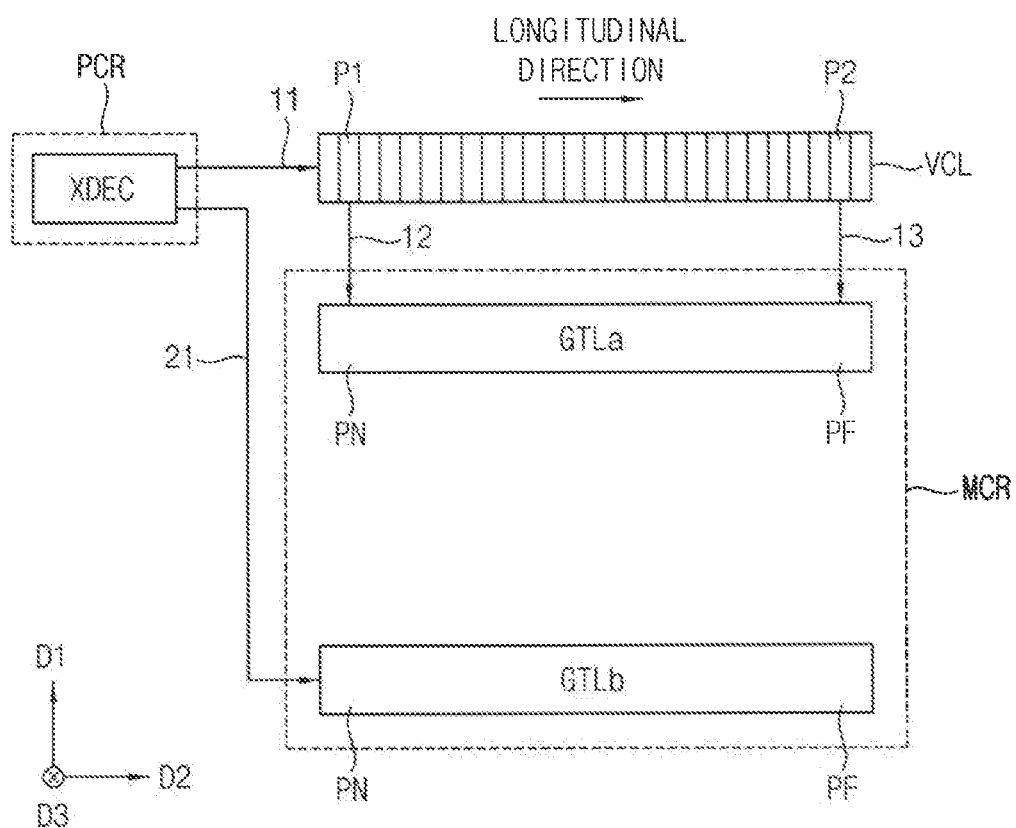
FIG. 1 is a diagram illustrating a voltage compensation structure of a nonvolatile memory device according to an exemplary embodiment of the inventive concept.

Exemplary embodiments of the inventive concept provide a nonvolatile memory device to compensate for voltage drop of a target gate line having a relatively high resistance value.

Exemplary embodiments of the inventive concept will be described more fully hereinafter with reference to the accompanying drawings. Like reference numerals may refer to like elements throughout this application.

FIG. 1 is a diagram illustrating a voltage compensation structure of a nonvolatile memory device according to an exemplary embodiment of the inventive concept.

Referring to FIG. 1, a nonvolatile memory device may include a plurality of gate lines GTLa and GTLb, an address decoder XDEC, at least one voltage compensation line VCL, and conduction paths 11, 12, 13, and 21. The address decoder XDEC is formed in a peripheral circuit region PCR and the plurality of gate lines GTLa and GTLb are formed in a memory cell region MCR. The voltage compensation line VCL may be formed in the peripheral circuit region PCR and/or the memory cell region MCR according to exemplary embodiments of the inventive concept.

As will be described below, the address decoder XDEC may be disposed under the plurality of gate lines GTLa and GTLb to drive the plurality of gate lines GTLa and GTLb. The plurality of gate lines GTLa and GTLb extend in a longitudinal direction D2 and are stacked in a vertical direction D1 to form a memory block. The longitudinal direction D2 may be referred to as a row direction. The plurality gate lines GTLa and GTLb may include a target gate line GTLa and a non-target gate line GTLb. FIG. 1 illustrates one target gate line and one non-target gate line for convenience of illustration, but the number of the gate lines may vary.

The voltage compensation line VCL extends in the row direction D2 substantially in parallel with the plurality of gate lines GTLa and GTLb. The voltage compensation line VCL may overlap with the target gate line GTLa in the vertical direction D1. As will be described below, the conduction paths 11, 12, 13, and 21 may include vertical contacts, conduction lines, etc. The conduction path 11 connects the address decoder XDEC and a first portion P1 of the voltage compensation line VCL. The conduction path 11 may include a rising vertical contact extending in the vertical direction D1. Here "rising" in the rising vertical contact indicates that a driving voltage is transferred through the rising vertical contact in an upward direction. Similarly, "falling" in a falling vertical contact indicates that a driving voltage is transferred through the falling vertical contact in a downward direction. The conduction path 12 (e.g., a near conduction path 12) connects, in the vertical direction D1, the first portion P1 of the voltage compensation line VCL and a near end portion PN of the target gate line GTLa. The conduction path 13 (e.g., a far conduction path 13) connects, in the vertical direction D1, a second portion P2 of the voltage compensation line VCL and a far end portion PF of the target gate line GTLa. The conduction path 21 connects the address decoder XDEC and the near end portion PN of the non-target gate line GTLb.

The target gate line GTLa may be formed of material different from the non-target gate line GTLb. In an exemplary embodiment of the inventive concept, the target gate line GTLa may be formed of polysilicon and the non-target gate line GTLb may be formed of metal. Resistance of the target gate line GTLa may be larger than resistance of the non-target gate line GTLb.

A first resistance value of the target gate line GTLa from the near end portion PN to the far end portion PF may be larger than a second resistance value of the non-target gate line GTLb from the near end portion PN to the far end portion PF. For example, the target gate line GTLa may be formed of polysilicon and the non-target gate line GTLb may be formed of tungsten, and the first resistance value may be significantly larger than the second resistance value. In this case, a setup time of the driving voltage at the far end portion PF of the non-target gate line GTLb may be relatively short but a setup time of the driving voltage at the far end portion PF of the target gate line GTLa may be relatively long. The increase of the setup time of the target gate line GTLa may reduce the entire operation speed of the nonvolatile memory device and degrade the performance of the nonvolatile memory device.

According to an exemplary embodiment of the inventive concept, the voltage drop of the target gate line GTLa having higher resistance may be compensated for and the setup time may be reduced by additional applying the driving voltage to the far end portion PF of the target gate line GTLa using the voltage compensation line VCL having lower resistance. A resistance value of a conduction path from the first portion P1 of the voltage compensation line VCL to the far end portion PF of the target gate line GTLa via the voltage compensation line VCL may be set to be smaller than a resistance value of a conduction path from the first portion P1 of the voltage compensation line VCL to the far end portion PF of the target gate line GTLa via the target gate line GTLa.

As such, the nonvolatile memory device according to exemplary embodiments of the inventive concept may enhance performance of the nonvolatile memory device and a system including the nonvolatile memory device by compensating for the voltage drop of the target gate line having relatively higher resistance using the voltage compensation line having relatively lower resistance to reduce deviations of driving voltages between gate lines.

Figure 2:
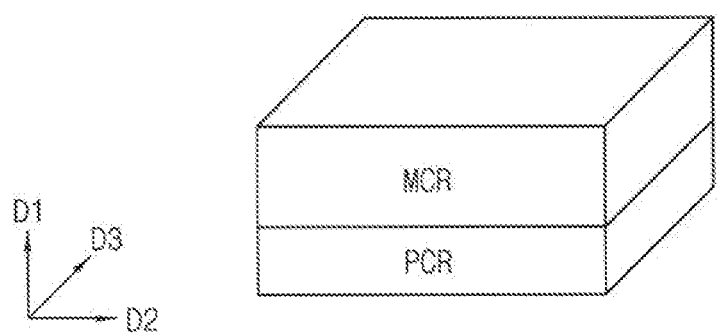
FIG. 2 is a perspective view of a nonvolatile memory device according to an exemplary embodiment of the inventive concept.

FIG. 2 is a perspective view of a nonvolatile memory device according to an exemplary embodiment of the inventive concept.

In FIG. 2, a direction substantially vertical to the top surface of a substrate is referred to as a first direction or the vertical direction D1, and two directions substantially parallel to the top surface of the substrate and crossing each other are referred to as a second direction (or the row direction) D2 and a third direction (or a column direction) D3. For example, the second and third directions D2 and D3 may be perpendicular to each other. Additionally, a direction indicated by an arrow in the figures and a reverse direction thereof are considered as the same direction. The definition of the first, second and third directions D1, D2, and D3 are the same in the figures cited in this disclosure.

Referring to FIG. 2, a nonvolatile memory device may include the peripheral circuit region PCR in which a peripheral circuit is formed and the memory cell region MCR in which a memory cell array is formed.

The peripheral circuit region PCR may include a semiconductor substrate and a peripheral circuit formed at the semiconductor substrate, as will be described below. The address decoder XDEC in FIG. 1 may be formed in the peripheral circuit region PCR. The memory cell region MCR may include a memory cell array. As such, a size of the nonvolatile memory device may be reduced by adopting a cell over periphery (COP) structure, as illustrated in FIG. 2, in which the peripheral circuit is formed on the semiconductor substrate and the memory cell array is stacked on the peripheral circuit.

Figure 3:
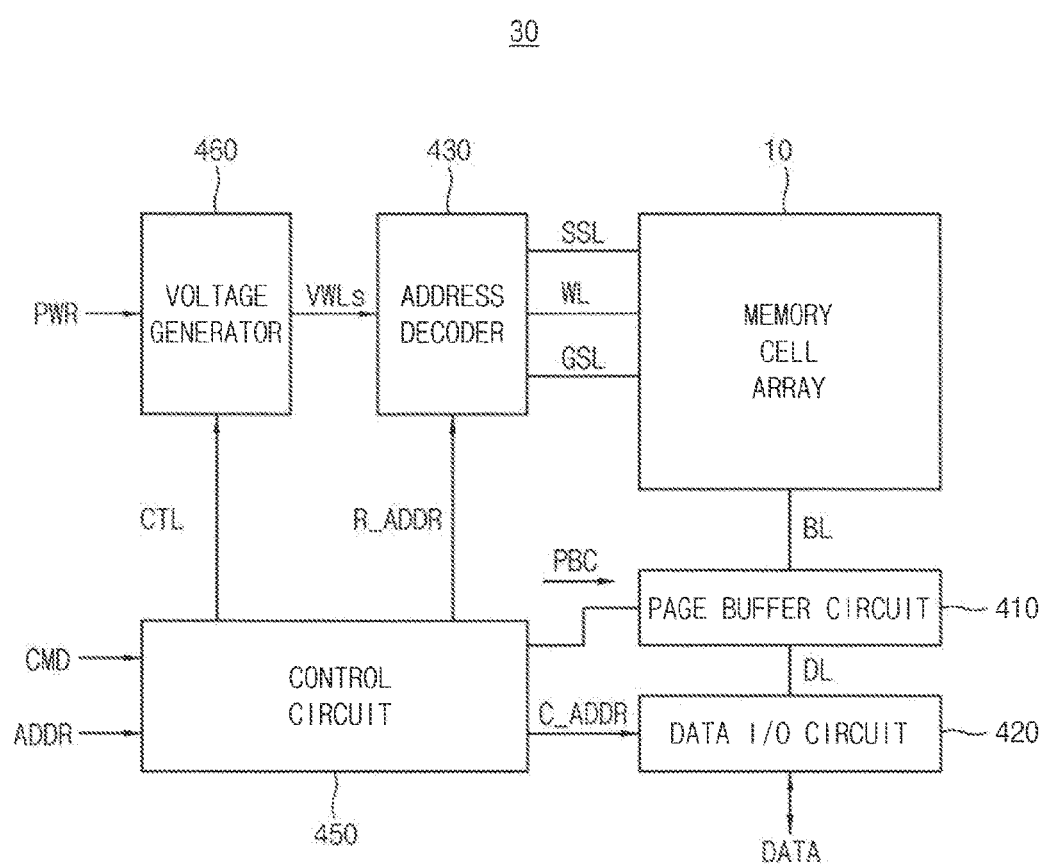
FIG. 3 is a block diagram illustrating a nonvolatile memory device according to an exemplary embodiment of the inventive concept.

FIG. 3 is a block diagram illustrating a nonvolatile memory device according to an exemplary embodiment of the inventive concept.

Referring to FIG. 3, a nonvolatile memory device 30 may include a memory cell array 10, a page buffer circuit 410, a data input/output (I/O) circuit 420, an address decoder 430, a control circuit 450, and a voltage generator 460.

The memory cell array 10 may be coupled to the address decoder 430 through a plurality of string selection lines SSL, a plurality of word lines WL, and a plurality of ground selection lines GSL. In addition, the memory cell array 10 may be coupled to the page buffer circuit 410 through a plurality of bit lines BL.

The memory cell array 10 may include a plurality of memory cells coupled to the plurality of word lines WL and the plurality of bit lines BL. In an exemplary embodiment of the inventive concept, the memory cell array 10 may be a three-dimensional memory cell array, which is formed on a substrate in a three-dimensional structure (or a vertical structure). In this case, the memory cell array 10 may include a plurality of NAND strings that are vertically oriented such that at least one memory cell is located over another memory cell.

The control circuit 450 may receive a command (signal) CMD and an address (signal) ADDR from the memory controller 20 and control erasure, programming, and read operations of the nonvolatile memory device 30 based on the command signal CMD and the address signal ADDR. An erasure operation may comprise performing a sequence of erase loops, and a program operation may include performing a sequence of program loops. Each erase loop may include an erase operation and an erase verification operation. Each program loop may include a program operation and a program verification operation. The read operation may include a normal read operation and a data recover read operation.

For example, the control circuit 450 may generate control signals CTL, which are used for controlling the voltage generator 460, and may generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 10 through the plurality of string selection lines SSL, the plurality of word lines WL, and the plurality of ground selection lines GSL. During the program operation or the read operation, the address decoder 430 may determine one of the plurality of word lines WL as a selected word line and determine the rest of the plurality of word lines WL except for the selected word line as unselected word lines, based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines, based on the row address R_ADDR.

The voltage generator 460 may generate word line voltages VWL for the operation of the memory cell array 10 of the nonvolatile memory device 30, based on the control signals CTL. The voltage generator 460 may receive power PWR from the memory controller 20. The word line voltages VWL may be applied to the plurality of word lines WL through the address decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

The page buffer circuit 410 may be coupled to the memory cell array 10 through the plurality of bit lines BL. The page buffer circuit 410 may include a plurality of buffers. In an exemplary embodiment of the inventive concept, each of the plurality of buffers may be connected to only one bit line. In an exemplary embodiment of the inventive concept, each of the plurality of buffers may be connected to two or more bit lines.

The page buffer circuit 410 may temporarily store data to be programmed in a selected page or data read out from the selected page of the memory cell array 10.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 10 and stored in the page buffer circuit 410, to the memory controller 20 based on the column address C_ADDR received from the control circuit 450.

In addition, the page buffer circuit 410 and the data input/output circuit 420 may read data from a first area of the memory cell array 10 and write this read data to a second area of the memory cell array 10 (e.g., without transmitting the data to a source external to the nonvolatile memory device 30, such as to the memory controller 20). In other words, the page buffer circuit 410 and the data input/output circuit 420 may perform a copy-back operation.

Figure 4:
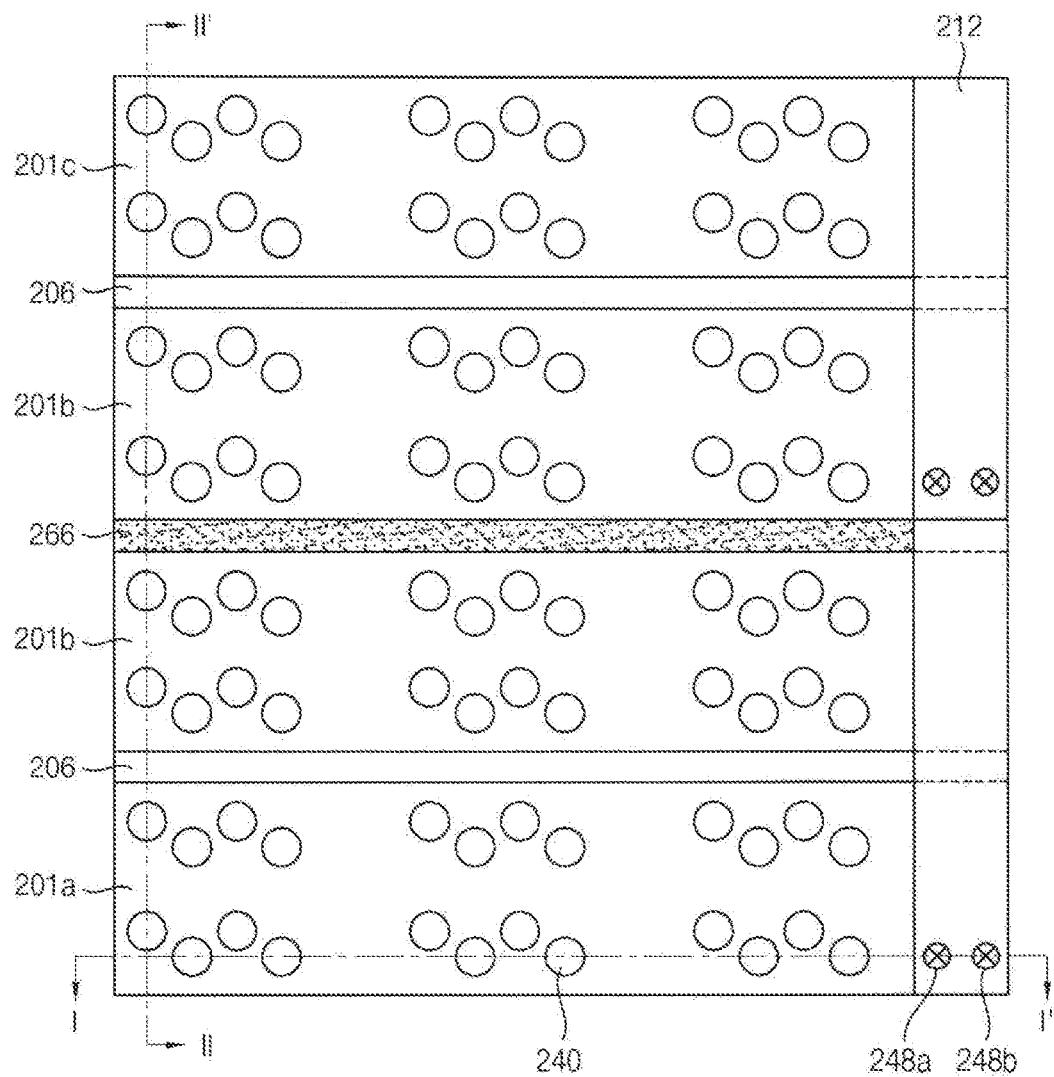
FIG. 4 is a top view of a nonvolatile memory device according to an exemplary embodiment of the inventive concept.
Figure 5:
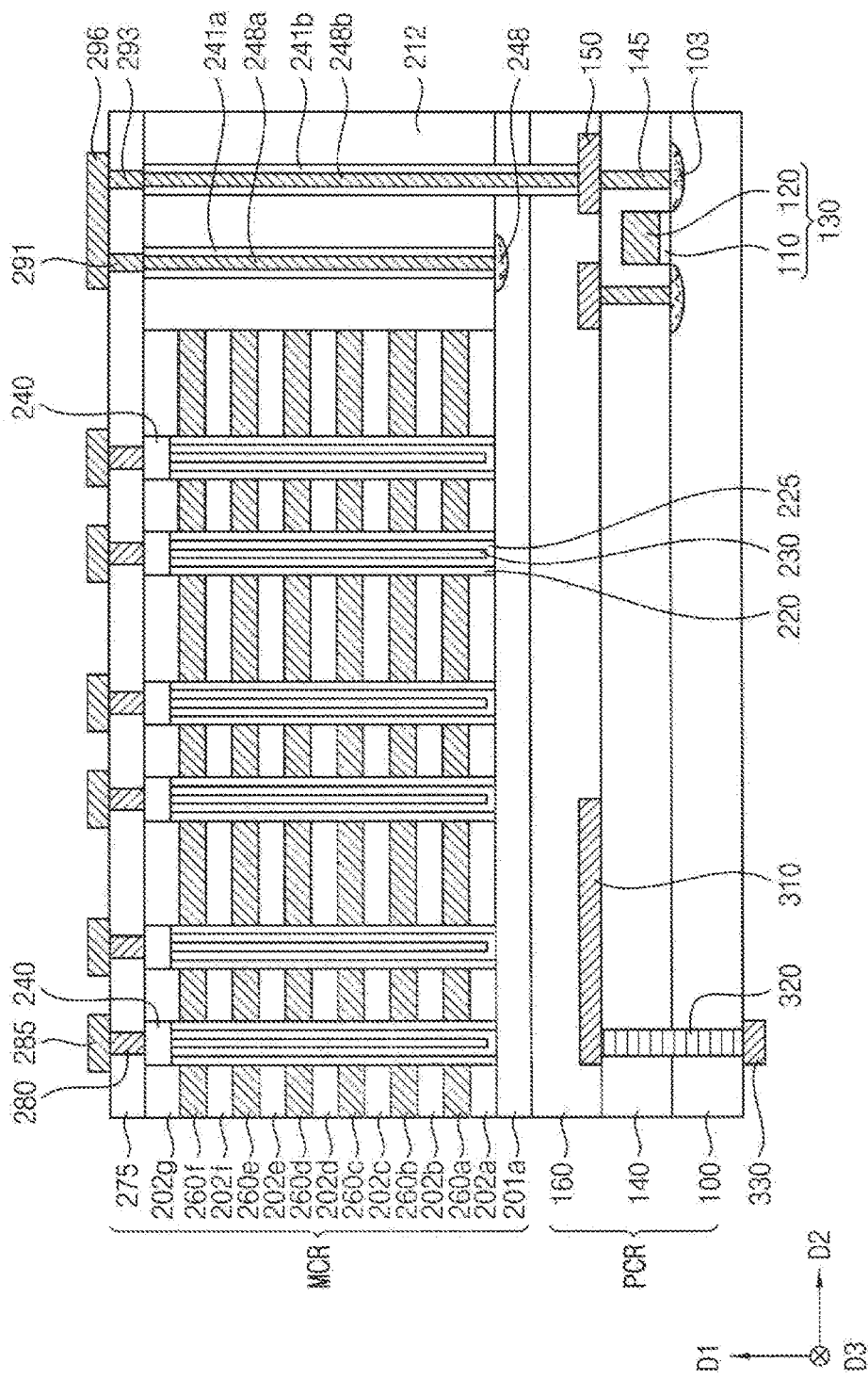
FIG. 5 is a cross-sectional view taken along a line I-I' in FIG. 4 according to an exemplary embodiment of the inventive concept.
Figure 6:
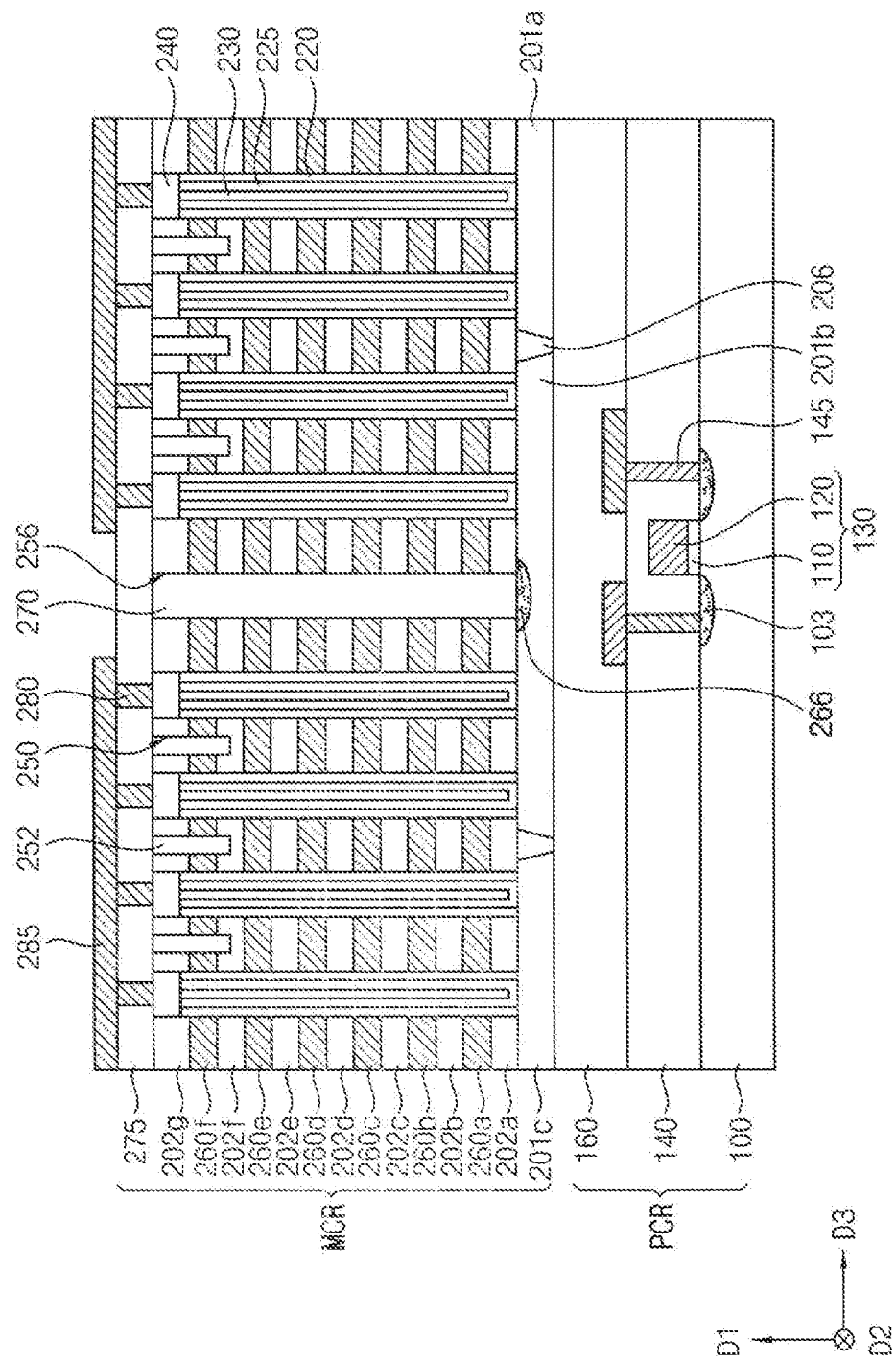
FIG. 6 is a cross-sectional view taken along a line II-II' in FIG. 4 according to an exemplary embodiment of the inventive concept.

FIG. 4 is a top view of a nonvolatile memory device according to an exemplary embodiment of the inventive concept, FIG. 5 is a cross-sectional view taken along a line I-I' in FIG. 4 according to an exemplary embodiment of the inventive concept, and FIG. 6 is a cross-sectional view taken along a line II-II' in FIG. 4 according to an exemplary embodiment of the inventive concept.

In an exemplary embodiment of the inventive concept, a non-volatile memory device may have a cell over periphery (COP) structure in which a memory cell structure is stacked on a peripheral circuit. The memory cell structure may have a vertical NAND flash memory device structure in which a plurality of NAND flash memory cells are formed vertically, e.g., in the first direction D1, with respect to a top surface of a substrate.

For a clear and concise description, some elements of the memory device are not shown in FIG. 4. For example, FIG. 4 illustrates base layer patterns 201a, 201b, and 201c, separation layer patterns 206, a second impurity region 266, a mold protection layer 212, a first connecting contact 248a, and a second connecting contact 248b, and the other elements described above are omitted.

Referring to FIGS. 4 to 6, the memory device may include the peripheral circuit region PCR including a peripheral circuit structure and the memory cell region MCR including a memory cell structure.

The peripheral circuit region PCR may include, e.g., a transistor including a gate structure 130 and a source/drain region 103 formed on a substrate 100, lower insulation layers 140 and 160, a lower contact 145, and lower wirings 150 and 310.

The substrate 100 may include a semiconductor material, e.g., single crystalline silicon or single crystalline germanium. The gate structure 130 may include a gate insulation layer pattern 110 and a gate electrode 120, which are stacked on the substrate 100. The transistor may be disposed on the substrate 100.

The gate insulation layer pattern 110 may include, e.g., silicon oxide or a metal oxide. The gate electrode 120 may include, e.g., a metal, a metal nitride, or doped polysilicon. The source/drain region 103 may include n-type or p-type impurities.

A first lower insulation layer 140 may be formed on the substrate 100 to cover a structure such as the transistor, and the lower contact 145 may extend through the first lower insulation layer 140 to be electrically connected to the source/drain region 103.

The lower wirings 150 and 310 may be disposed on the first lower insulation layer 140, and may be electrically connected to the lower contact 145 and a through-substrate via 320, respectively. The through-substrate via 320 may be connected to a bottom pad 330. A second lower insulation layer 160 may be formed on the first lower insulation layer 140 to cover the lower wirings 150 and 310. FIG. 5 illustrates a non-limiting example where the lower wirings 150 and 310 are formed in the same layer, but the lower wirings 150 and 310 may be distributed in different wiring layers, as will be described below with reference to FIG. 17.

The first and second lower insulation layers 140 and 160 may include an insulating material, e.g., silicon oxide. The lower contact 145 and the lower wirings 150 and 310 may include, e.g., a metal, a metal nitride, or doped polysilicon.

The memory cell region MCR may include first to third base layer patterns 201a, 201b, and 201c, a channel 225, a gate line 260, a bit line 285, and a connecting wiring 296, etc.

The separation layer pattern 206 may extend in the second direction D2, and a plurality of the separation layer patterns 206 may be arranged along the third direction D3. Thus, a base layer may be physically divided into the first to third base layer patterns 201a, 201b, and 201c. FIGS. 4 to 6 illustrate three base layer patterns 201a, 201b and 201c; however, the number of base layer patterns is not limited thereto.

The base layer patterns 201a, 201b, and 201c may include polysilicon or single crystalline silicon. In exemplary embodiments of the inventive concept, the base layer patterns 201a, 201b, and 201c may further include p-type impurities such as boron (B). In this case, the base layer patterns 201a, 201b, and 201c may serve as a p-type well.

The separation layer pattern 206 may be extended linearly in the second direction D2. The base layer patterns 201a, 201b, and 201c may be physically separated by the separation layer pattern 206. The separation layer pattern 206 may include an insulation layer pattern, e.g., silicon oxide.

The channel 225 may be disposed on the base layer patterns 201a, 201b, and 201c, and may extend in the first direction D1 from top surfaces of the base layer patterns 201a, 201b, and 201c. The channel 225 may have a hollow cylindrical shape or a cup shape. The channel 225 may include polysilicon or single crystalline silicon, and may include an impurity region doped with, e.g., p-type impurities such as boron.

A plurality of the channels 225 may be arranged in the second direction D2 to form a channel row, and a plurality of the channel rows may be arranged in the third direction D3. In an exemplary embodiment of the inventive concept, the channels 225 included in the neighboring channel rows may be arranged in a zigzag arrangement to face one another. Thus, a density of the channels 225 in a unit area of the base layer pattern 201a, 201b, and 201c may be increased.

A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

According to an exemplary embodiment of the inventive concept, the channel 225 may have a pillar shape or a solid cylindrical shape. In this case, the filling layer pattern 230 may be omitted.

A dielectric layer structure 220 may be formed on an outer sidewall of the channel 225. The dielectric layer structure 220 may have a cup shape of which a central bottom is opened, or a straw shape.

The dielectric layer structure 220 may include a tunnel insulation layer, a charge storage layer, and a blocking layer which may be sequentially stacked from the outer sidewall of the channel 225. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 220 may have an oxide-nitride-oxide (ONO) layers-stacked structure.

A pad 240 may be formed on the filling layer pattern 230, the channel 225, and the dielectric layer structure 220. For example, the filling layer pattern 230, the channel 225, and the dielectric layer structure 220 may be capped or closed by the pad 240. The pad 240 may include a polysilicon or single crystalline silicon. The pad 240 may further include n-type impurities, for example, phosphorus (P) or arsenic (As).

As illustrated in FIG. 5, a plurality of the pads 240 may be arranged in the second direction D2 to form a pad row substantially comparable to the channel row. A plurality of the pad rows may be arranged in the third direction D3.

The gate lines 260 (e.g., 260a through 260f) may be disposed on an outer sidewall of the dielectric layer structure 220 and may be spaced apart from one another in the first direction D1. In an exemplary embodiment of the inventive concept, each gate line 260 may surround the channels 225 of at least one channel row and may be extended in the second direction D2.

For example, as illustrated in FIGS. 4 to 6, each gate line 260 may surround six channel rows, however, the number of channel rows surrounded by each gate line 260 is not limited thereto.

The gate line 260 may include a metal having a low electrical resistance and/or a nitride thereof. For example, the gate line 260 may include tungsten (W), tungsten nitride, titanium (Ti), titanium nitride, tantalum (Ta), tantalum nitride, platinum (Pt), or the like. In exemplary embodiments of the inventive concept, the gate line 260 may have a multi-layered structure including a barrier layer formed of a metal nitride and a metal layer. As will be described below with reference to FIG. 10, some of the gate lines 260 may be a stopper line. The stopper line may be formed of polysilicon for an appropriate etch rate according to a manufacturing process.

For example, a lowermost gate line 260a may serve as a ground selection line (GSL). Four gate lines 260b, 260c, 260d, and 260e on the GSL may serve as word lines. An uppermost gate line 260f on the word lines may serve as a string selection line (SSL).

In this case, the GSL, the word lines, and the SSL may be formed at a single level, four levels, and a single level, respectively. However, each of the number of levels of the GSL, the word lines, and the SSL is not specifically limited. According to exemplary embodiments of the inventive concept, the GSL and the SSL may be formed at two levels, and the word lines may be formed at 2^n levels, such as 4, 8, or 16 levels. The stacked number of the gate lines 260 may be determined in consideration of a circuit design and a degree of integration of the semiconductor device.

Insulating interlayers 202 (e.g., 202a to 202g) may be disposed between the gate lines 260 along the first direction D1. The insulating interlayers 202 may include a silicon oxide based material, e.g., silicon dioxide (SiO2), silicon oxycarbide (SiOC), or silicon oxyfluoride (SiOF). The gate lines 260 may be insulated from one another along the first direction D1 by the insulating interlayers 202.

A gate line cut region 256 may be formed through the gate lines 260 and the insulating interlayers 202 along the first direction D1. The gate line cut region 256 may have a trench shape or a ditch shape extending in the second direction D2.

A gate line cut pattern 270 extending in the second direction D2 may be disposed on the second impurity region 266. A plurality of the second impurity regions 266 and the gate line cut patterns 270 may be arranged along the third direction D3. In exemplary embodiments of the inventive concept, the second impurity region 266 may include n-type impurities, for example, phosphorus (P) or arsenic (As). The gate line cut pattern 270 may include an insulation layer pattern, e.g., silicon oxide. A metal silicide pattern, such as a cobalt silicide pattern and/or a nickel silicide pattern, may be further formed on the second impurity region 266.

In an exemplary embodiment of the inventive concept, a cell block sharing the gate lines 260 may be defined by the gate line cut pattern 270. The cell block may be divided into sub-cell blocks by the separation layer pattern 206. Thus, a dimension or a size of an individual block may be reduced, so that a segmented operational control may be achieved, In an exemplary embodiment of the inventive concept, one of the second impurity regions 266 and one of the gate line cut patterns 270 may be provided per each base layer pattern 201a, 201b, and 201c. As illustrated in FIG. 6, for example, the second impurity region 266 may be formed at a central region of the second base layer pattern 201b, and the gate line cut pattern 270 may be disposed on the second impurity region 266.

A connecting contact and a connecting wiring may be provided per each base layer pattern 201a, 201b, and 201c to transfer an electrical signal and/or a voltage from a peripheral circuit.

In an exemplary embodiment of the inventive concept, the mold protection layer 212 may be formed on lateral portions of the base layer pattern 201a, 201b, and 201c, and the separation layer pattern 206. The first connecting contact 248a may extend through the mold protection layer 212 to make contact with a first impurity region 248 formed at the lateral portion of the base layer pattern 201a, 201b, and 201c. The second connecting contact 248b may extend through the mold protection layer 212, the base layer patterns 201a, 201b, and 201c, and the second lower insulation layer 160 to make contact with the lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to be in contact with the first connecting contact 248a and the second connecting contact 248b, respectively. The connecting wiring 296 may be disposed on the upper insulation layer 275 to electrically connect the first and second plugs 291 and 293.

An upper gate line cut pattern 252 may be formed in an upper gate line cut region 250. The upper gate line cut pattern 252 may include an insulation material, e.g., silicon oxide.

In an exemplary embodiment of the inventive concept, the upper gate line cut region 250 or the upper gate line cut pattern 252 may be provided for a separation of the SSL in each cell block. In this case, the upper gate line cut region 250 or the upper gate line cut pattern 252 may extend through an uppermost insulating interlayer 202g and the SSL 260f, and may extend partially through an insulating interlayer 202f directly under the SSL 260f.

The upper insulation layer 275 may be formed on the uppermost insulating interlayer 202g, the pad 240, the upper gate line cut pattern 252, the gate line cut pattern 270, the first connecting contact 248a and the second connecting contact 248b.

A bit line contact 280 may be formed through the upper insulation layer 275 to make contact with the pad 240. A plurality of the bit line contacts 280 may be formed to define an array comparable to an arrangement of the channels 225 or the pads 240.

The bit line 285 may be disposed on the upper insulation layer 275 to be electrically connected to the bit line contact 280. For example, the bit line 285 may extend in the third direction D3 to be electrically connected to a plurality of the bit line contacts 280. The bit line 285 and the separation layer pattern 205 may extend in substantially the same direction.

According to the exemplary embodiments described above, the base layer patterns 201a, 201b, and 201c may be physically separated by the separation layer pattern 206. Thus, the first to third base layer patterns 201a, 201b, and 201c are capable of being operated independently or individually.

The cell block may be further segmented or divided by the separation layer pattern 206, and thus signal interference or disturbance due to a large size of the cell block may be reduced. Thus, reliability of the semiconductor device may be increased.

Figure 7:
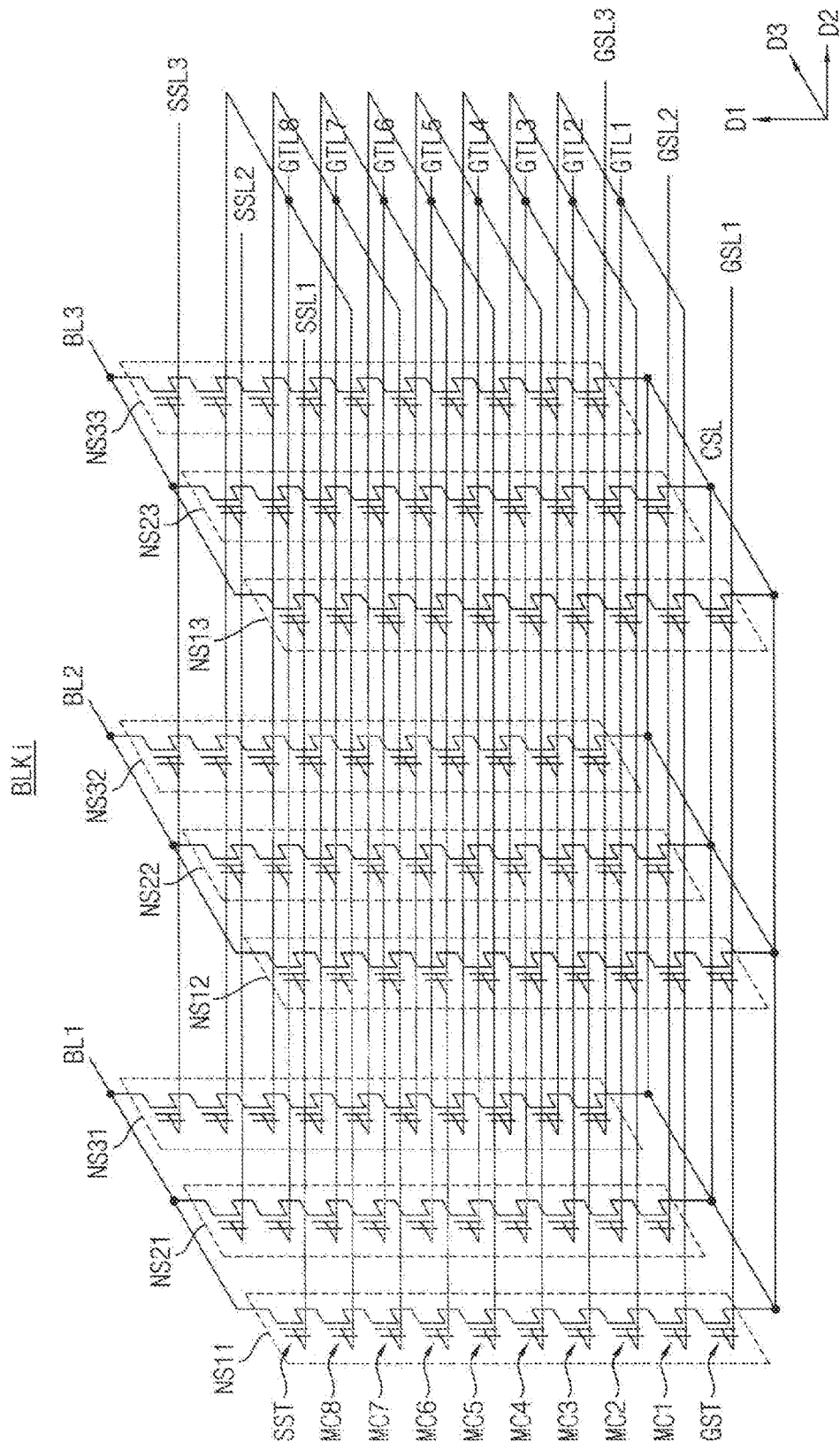
FIG. 7 is a circuit diagram illustrating an equivalent circuit of a memory block as described with reference to FIGS. 4 through 6 according to an exemplary embodiment of the inventive concept.

FIG. 7 is a circuit diagram illustrating an equivalent circuit of a memory block as described with reference to FIGS. 4 through 6 according to an exemplary embodiment of the inventive concept.

A memory cell array may include a plurality of memory blocks. A memory block BLKi of FIG. 7 may be formed on a substrate in a three-dimensional structure (or a vertical structure). For example, a plurality of NAND strings or cell strings included in the memory block BLKi may be formed in the first direction D1 perpendicular to the upper surface of the substrate.

Referring to FIG. 7, the memory block BLKi may include NAND strings NS11 to NS33 coupled between bit lines BL1, BL2, and BL3 and a common source line CSL. Each of the NAND strings NS11 to NS33 may include a string selection transistor SST, a plurality of memory cells MC1 to MC8, and a ground selection transistor GST. In FIG. 7, each of the NAND strings NS11 to NS33 is illustrated to include eight memory cells MC1 to MC8. However, the inventive concept is not limited thereto. In exemplary embodiments of the inventive concept, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to corresponding gate lines GTL1 to GTL8, respectively. The gate lines GTL1 to GTL8 may be word lines, of which some may be dummy word lines. In addition, some of the gate lines GTL1 to GTL8 may be intermediate switching lines and the memory cells connected to the intermediate switching lines may be referred to as intermediate switching transistors. Each ground selection transistor GST may be connected to a corresponding ground selection line (one of GSL1 to GSL3). Each string selection transistor SST may be connected to a corresponding bit line (e.g., one of BL1, BL2, and BL3), and each ground selection transistor GST may be connected to the common source line CSL.

Word lines (e.g., WL1) having substantially the same height may be commonly connected, and the ground selection lines GSL1 to GSL3 and the string selection lines SSL1 to SSL3 may be separated. Additionally, the gate lines corresponding to the intermediate switching lines may be separated, as will be described below. In FIG. 7, the memory block BLKi is illustrated to be coupled to eight gate lines GTL1 to GTL8 and three bit lines BL1 to BL3. However, the inventive concept is not limited thereto. Each memory block in the memory cell array 10 may be coupled to any number of word lines and any number of bit lines.

Figure 8:
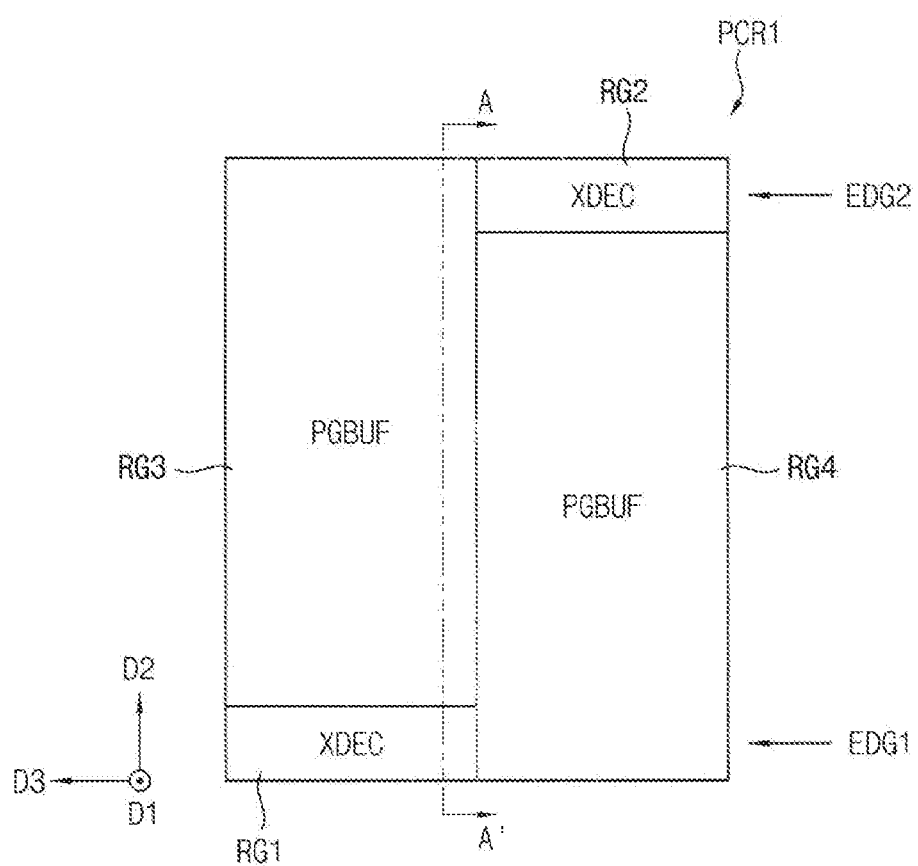
FIG. 8 is a diagram illustrating a windmill structure of a peripheral region in a nonvolatile memory device according to an exemplary embodiment of the inventive concept.

FIG. 8 is a diagram illustrating a windmill structure of a peripheral region in a nonvolatile memory device according to an exemplary embodiment of the inventive concept.

Referring to FIG. 8, a peripheral circuit region PCR1 may be divided into first through fourth regions RG1~RG4. The address decoder XDEC may be formed in the first and second regions RG1 and RG2. A page buffer circuit PGBUF may be formed in the third and fourth regions RG3 and RG4. The address decoder XDEC may be distributed in the first and second regions RG1 and RG2 so that the address decoder XDEC may cover a length in the first direction D1 that is perpendicular to the second direction D2 and simultaneously the page buffer circuit PGBUF may cover a length in the second direction D2. The structure of FIG. 8 may be referred to as a first windmill structure.

Figure 9:
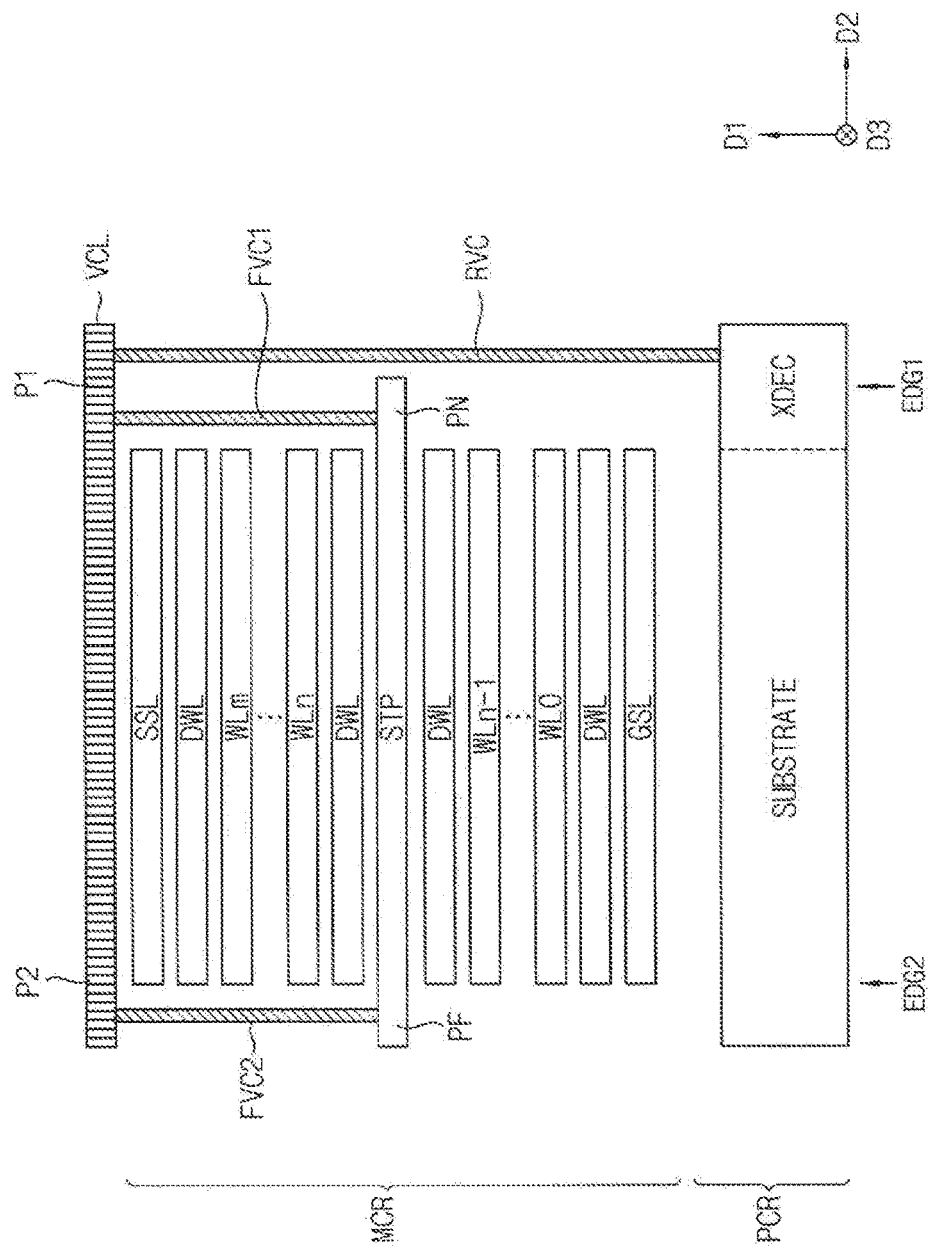
FIG. 9 is a cross-sectional diagram illustrating a voltage compensation structure applicable to the windmill structure of FIG. 8 according to an exemplary embodiment of the inventive concept.
Figure 11:
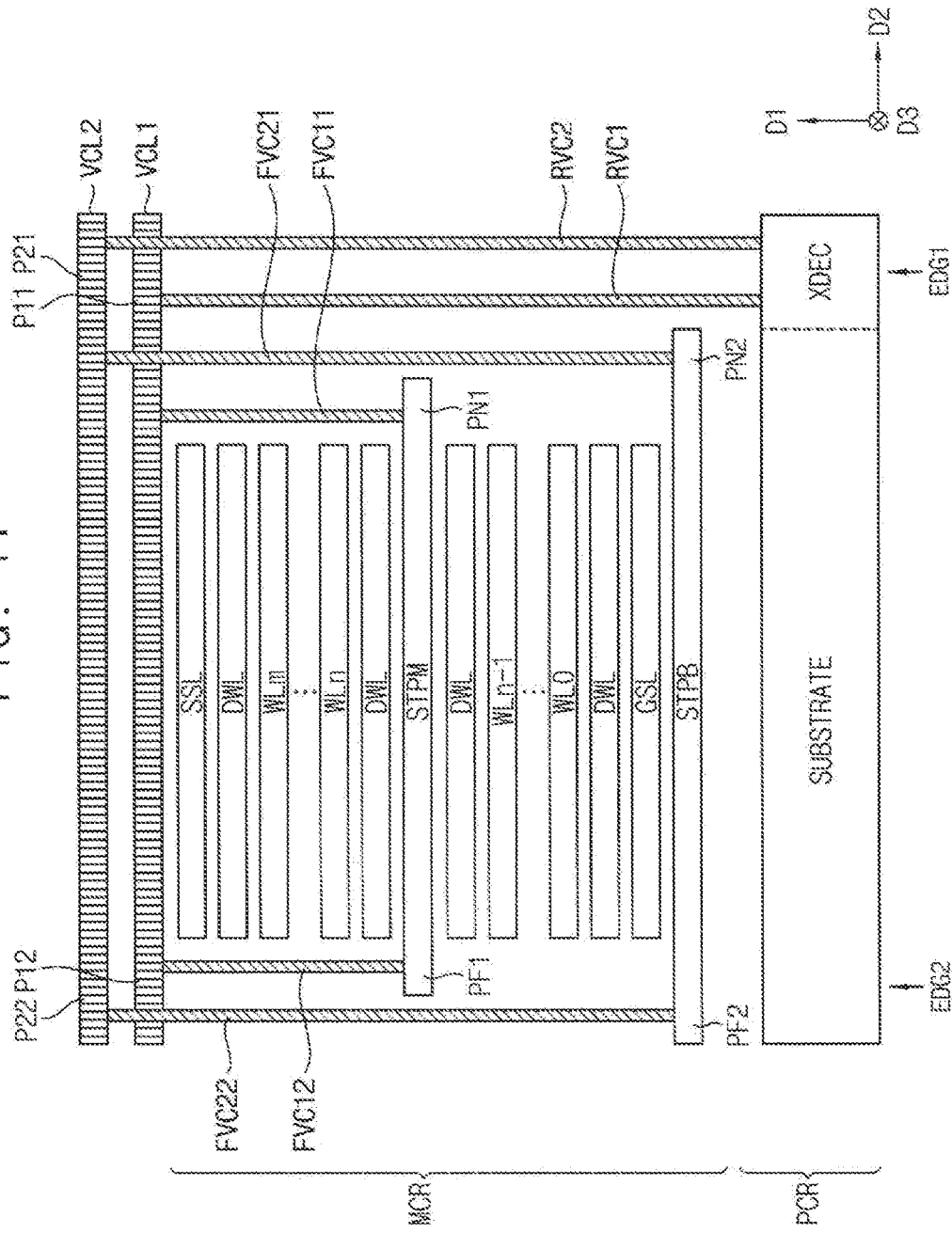
FIGS. 11 and 12 are cross-sectional diagrams illustrating a voltage compensation structure applicable to the windmill structure of FIG. 8 according to exemplary embodiments of the inventive concept.
Figure 12:
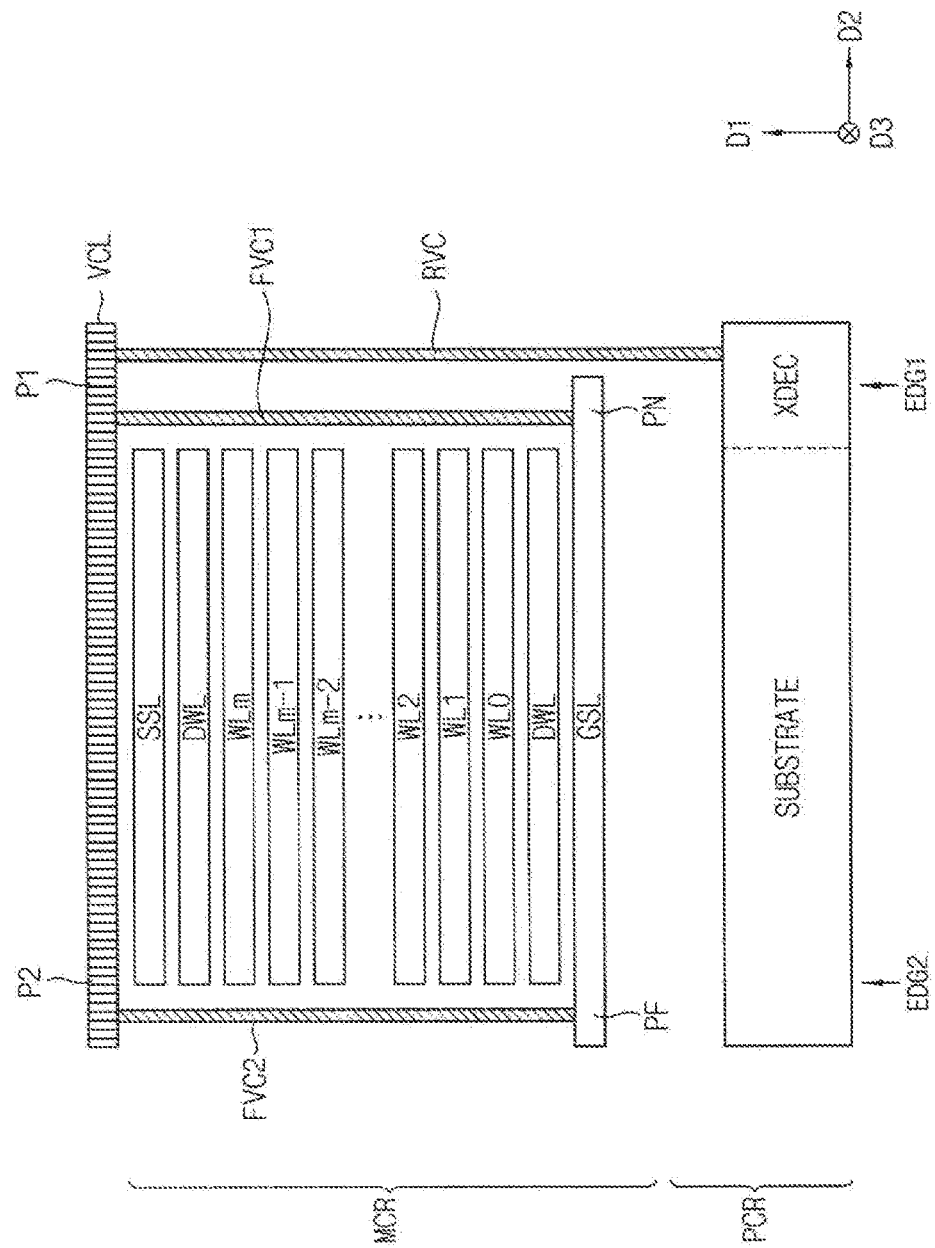

In the first windmill structure of FIG. 8, the address decoder XDEC may be disposed at a first edge portion EDG1 and a second edge portion EDG2 in the row direction D2 of the memory block that is formed in the memory cell region MCR over the peripheral circuit region PCR. Hereinafter, exemplary embodiments of a voltage compensation structure that may be applied to the first windmill structure are described with reference to FIGS. 9 through 12. FIGS. 9, 11, and 12 are cross-sectional views taken along a line A-A' in FIG. 8.

FIG. 9 is a cross-sectional diagram illustrating a voltage compensation structure applicable to the windmill structure of FIG. 8 according to an exemplary embodiment of the inventive concept.

Referring to FIG. 9, a plurality of gate lines, which extend in the row direction D2 and are stacked in the vertical direction D1 to form a memory block, may include the string selection line SSL, word lines WL0~WLm, dummy word lines DWL, a stopper line STP, and the ground selection line GSL.

FIG. 9 illustrates an example where the voltage compensation line VCL is disposed over the plurality of gate lines and the above-described target gate line corresponds to the stopper line STP.

For example, the address decoder XDEC may be disposed in the first edge portion EDG1 in the second direction D2 of the memory block. In this case, the first portion P1 of the voltage compensation line VCL and the near end portion PN of the stopper line STP correspond to the first edge portion EDG1 in the vertical direction D1, and the second portion P2 of the voltage compensation line VCL and the far end portion PF of the stopper line STP correspond to the second edge portion EDG2 in the vertical direction D1.

The voltage compensation structure for transferring the driving voltage from the address decoder XDEC to the stopper line STP corresponding to the target gate line may include the voltage compensation line VCL, a rising vertical contact RVC, a first falling vertical contact FVC1, and a second falling vertical contact FVC2. The other conduction paths for transferring driving voltages to the other gate lines SSL, DWL, WL, and GSL corresponding to the non-target gate lines are omitted in FIG. 9 for convenience of illustration.

The rising vertical contact RVC corresponds to the conduction path 11 in FIG. 1, the first falling vertical contact FVC1 corresponds to the near conduction path 12 in FIG. 1, and the second falling vertical contact FVC2 corresponds to the far conduction path 13 in FIG. 1.

The voltage compensation line VCL extends in the row direction D2 substantially in parallel with the plurality of gate lines, and the voltage compensation line VCL overlaps in the vertical direction D1 with the stopper line STP. The rising vertical contact RVC extends in the vertical direction D1 to connect the address decoder XDEC and the first portion P1 of the voltage compensation line VCL. The first falling vertical contact FVC1 connects in the vertical direction D1 the first portion P1 of the voltage compensation line VCL and the near end portion PN of the stopper line STP. The second falling vertical contact FVC2 connects in the vertical direction D1 the second portion P2 of the voltage compensation line VCL and the far end portion PF of the stopper line STP.

As such, the voltage drop of the stopper line STP having relatively higher resistance may be compensated for by applying the driving voltage to the far end portion PF of the stopper line STP in addition to the near end portion PN, using the conduction path RVC, VCL, FVC1, and FVC2 having relatively lower resistance.

Figure 10:
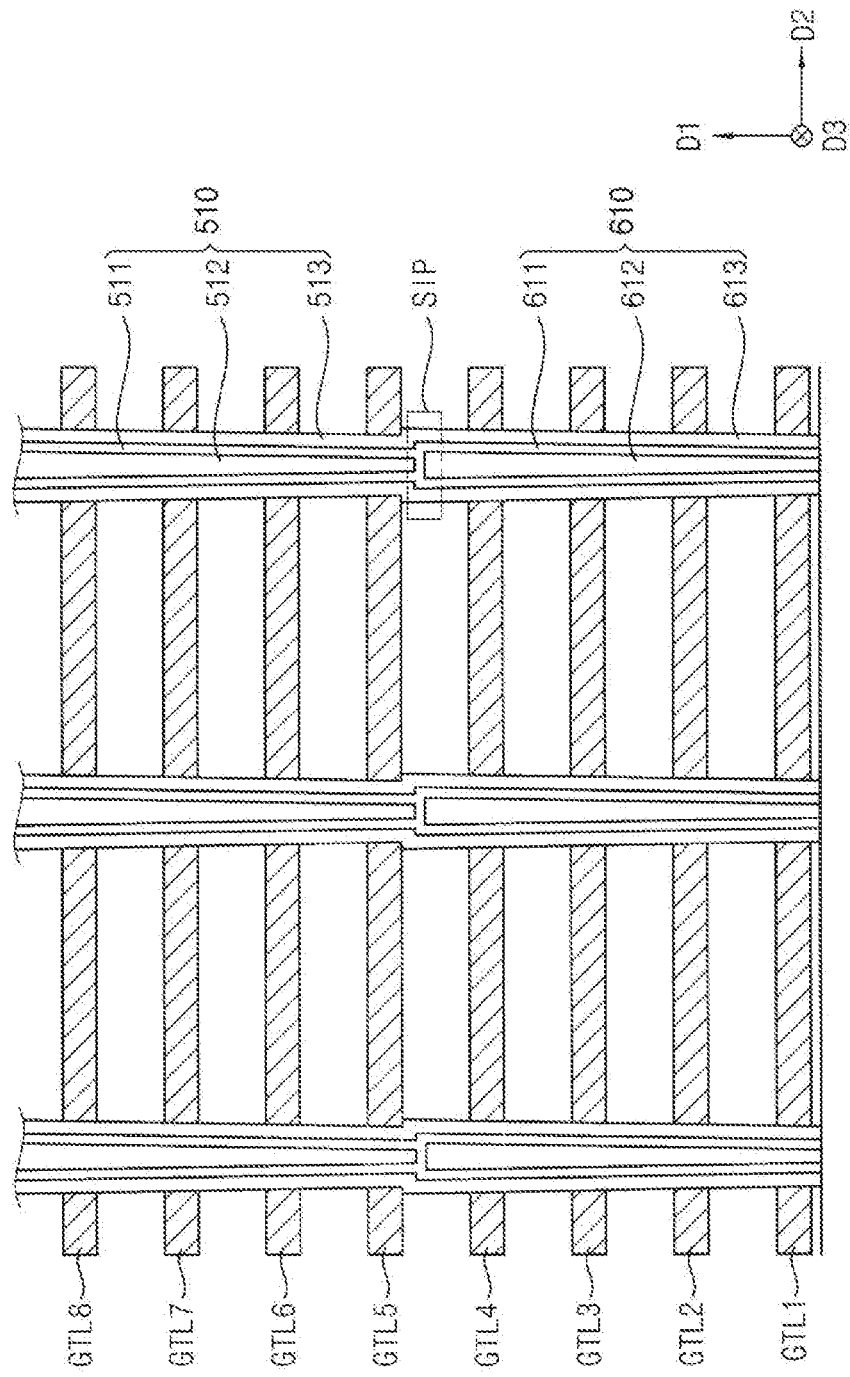
FIG. 10 is a diagram for describing a target gate line included in a nonvolatile memory device according to an exemplary embodiment of the inventive concept.

FIG. 10 is a diagram for describing a target gate line included in a nonvolatile memory device according to an exemplary embodiment of the inventive concept.

Referring to FIG. 10, a channel hole of each cell string STR may include a first sub channel hole 610 and a second sub channel hole 510. A channel hole may be referred to as a pillar. The first sub channel hole 610 may include a channel layer 611, an inner material 612, and an insulation layer 613. The second sub channel hole 510 may include a channel layer 511, an inner material 512, and an insulation layer 513. The channel layer 611 of the first channel hole 610 may be connected to the channel layer 511 of the second sub channel hole 510 through a P-type silicon pad SIP.

The sub channel holes 610 and 510 may be formed using a stopper line GTL5 having an appropriate etch rate. For example, the stopper line GTL5 may be formed of polysilicon and the other gate lines GTL1~GTL4 and the GTL6~GTL8 may be formed of metal such as tungsten to implement the appropriate etch rate. The resistance value of the stopper line GTL5 may be significantly larger than that of the other gate lines GTL1~GTL4 and GTL6~GTL8. Even though the resistance value of the stopper line may be varied depending on doping density of the polysilicon, the resistance value of the stopper line GTL5 may be about six times the resistance value of the other gate lines GTL1~GTL4 and GTL6~GTL8. The voltage drop of the stopper line having the relatively larger resistance value may be compensated for using the voltage compensation structure according to exemplary embodiments of the inventive concept.

FIGS. 11 and 12 are cross-sectional diagrams illustrating a voltage compensation structure applicable to the windmill structure of FIG. 8 according to exemplary embodiments of the inventive concept.

Referring to FIG. 11, a plurality of gate lines, which extend in the row direction D2 and are stacked in the vertical direction D1 to form a memory block, may include the string selection line SSL, the word lines WL0~WLm, the dummy word lines DWL, a first stopper line STPM, a second stopper line STPB, and the ground selection line GSL.

FIG. 11 illustrates an example where a first voltage compensation line VCL1 and a second voltage compensation line VCL2 are disposed over the plurality of gate lines and the above-described target gate line corresponds to the first stopper line STPM and the second stopper line STPB. The first voltage compensation line VCL1 compensates for the driving voltage of the first stopper line STPM disposed at a center portion of the plurality of gate lines, and the second voltage compensation line VCL2 compensates for the driving voltage of the second stopper line STPB disposed at a lowest portion of the plurality of gate lines.

For example, the address decoder XDEC may be disposed in the first edge portion EDG1 in the second direction D2 of the memory block. In this case, first portions P11 and P21 of the voltage compensation lines VCL1 and VCL2 and near end portions PN1 and PN2 of the stopper lines STPM and STPB correspond to the first edge portion EDG1 in the vertical direction D1, and second portions P22 and P12 of the voltage compensation lines VCL1 and VCL2 and far end portions PF1 and PF2 of the stopper lines STPM and STPB correspond to the second edge portion EDG2 in the vertical direction D1.

The voltage compensation structure for transferring the driving voltages from the address decoder XDEC to the stopper lines STPB and STPM corresponding to the target gate line may include the first voltage compensation line VCL1, the second voltage compensation line VCL2, a first rising vertical contact RVC1, a second rising vertical contact RVC2, a first falling vertical contact FVC11, a second falling vertical contact FVC21, a third falling vertical contact FVC12, and a fourth falling vertical contact FVC22. The other conduction paths for transferring driving voltages to the other gate lines SSL, DWL, WL, and GSL corresponding to the non-target gate lines are omitted in FIG. 11 for convenience of illustration.

The first and second rising vertical contacts RVC1 and RVC2 correspond to the conduction path 11 in FIG. 1, the first and second falling vertical contacts FVC11 and FVC21 correspond to the near conduction path 12 in FIG. 1, and the third and fourth falling vertical contact FVC12 and FVC22 correspond to the far conduction path 13 in FIG. 1.

The first and second voltage compensation lines VCL1 and VCL2 extend in the row direction D2 substantially in parallel with the plurality of gate lines, and the first and second voltage compensation lines VCL1 and VCL2 overlap in the vertical direction D1 with the first and second stopper lines STPM and STPB. The first and second rising vertical contact RVC1 and RVC2 extend in the vertical direction D1 to connect the address decoder XDEC and the first portions P11 and P21 of the first and second voltage compensation lines VCL1 and VCL2, respectively. The first and second falling vertical contacts FVC11 and FVC21 connect in the vertical direction D1 the first portions P11 and P21 of the first and second voltage compensation lines VCL1 and VCL2 and the near end portions PN1 and PN2 of the first and second stopper lines STPM and STPB, respectively. The third and fourth falling vertical contact FVC12 and FVC22 connect in the vertical direction D1 the second portions P12 and P22 of the first and second voltage compensation line VCL1 and VCL2 and the far end portions PF1 and PF2 of the first and second stopper lines STPM and STPB, respectively.

As such, the voltage drop of the stopper lines STPM and STPB having relatively higher resistance may be compensated for by applying the driving voltages to the far end portions PF1 and PF2 of the stopper lines STPM and STPB in addition to the near end portions PN1 and PN2, using the conduction paths RVC1, RVC2, VCL1, VCL2, FVC11, FVC21, FVC12, and FVC22 having relatively lower resistance.

Referring to FIG. 12, a plurality of gate lines, which extend in the row direction D2 and are stacked in the vertical direction D1 to form a memory block, may include the string selection line SSL, the word lines WL0~WLm, the dummy word lines DWL, and the ground selection line GSL.

FIG. 12 illustrates an example where the voltage compensation line VCL is disposed over the plurality of gate lines and the above-described target gate line corresponds to the ground selection line GSL. According to the manufacturing process of the memory block in the memory cell region MCR, the ground selection line GSL may be formed of material having larger resistance than the other gate lines SSL, WL, and DWL. The voltage compensation structure of FIG. 12 is substantially the same as that of FIG. 9 except that the target gate line is changed from the stopper line STP to the ground selection line GSL, and thus repeat descriptions are omitted.

Figure 13:
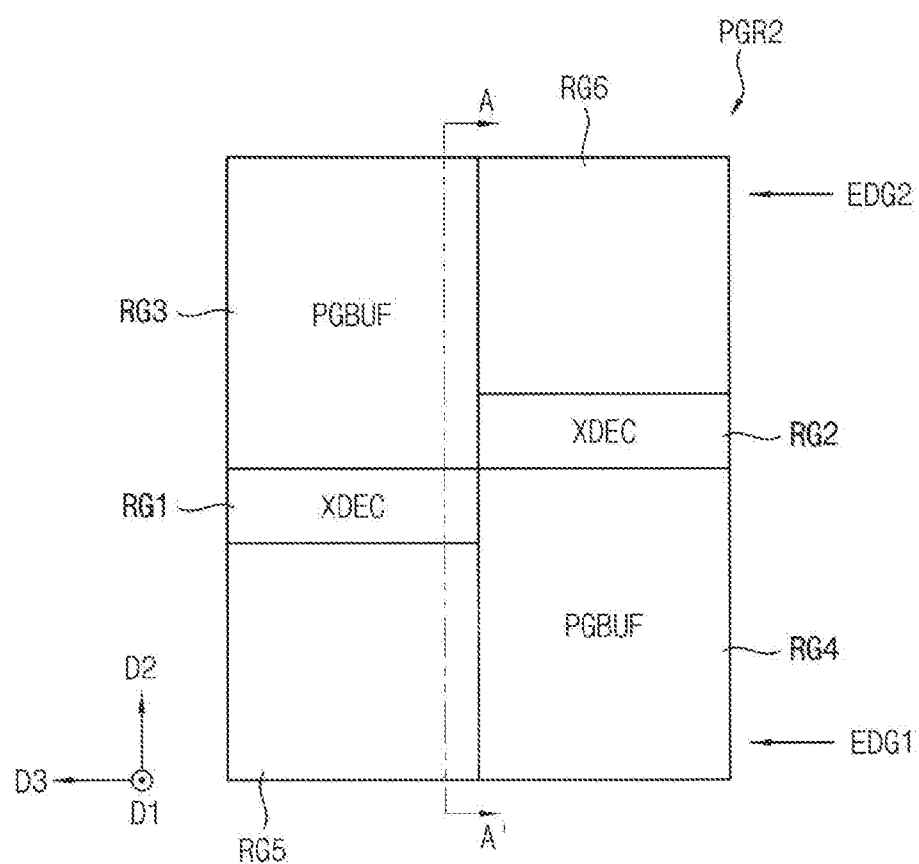
FIG. 13 is a diagram illustrating a windmill structure of a peripheral region in a nonvolatile memory device according to an exemplary embodiment of the inventive concept.

FIG. 13 is a diagram illustrating a windmill structure of a peripheral region in a nonvolatile memory device according to an exemplary embodiment of the inventive concept.

Referring to FIG. 13, a peripheral circuit region PCR2 may be divided into first through sixth regions RG1~RG6. The address decoder XDEC may be formed in the first and second regions RG1 and RG2. The page buffer circuit PGBUF may be formed in the third and fourth regions RG3 and RG4. The address decoder XDEC may be distributed in the first and second regions RG1 and RG2 so that the address decoder XDEC may cover a length in the first direction D1 that is perpendicular to the second direction D2 and simultaneously the page buffer circuit PGBUF may cover a length in the second direction D2. The structure of FIG. 13 may be referred to as a second windmill structure.

In the second windmill structure of FIG. 13, the address decoder XDEC may be disposed at a center portion between the first edge portion EDG1 and the second edge portion EDG2 in the row direction D2 of the memory block that is formed in the memory cell region MCR over the peripheral circuit region PCR. Hereinafter, exemplary embodiments of a voltage compensation structure that may be applied to the second windmill structure are described with reference to FIGS. 14, 15, and 16, which are cross-sectional views taken along a line A-A' in FIG. 13.

Figure 14:
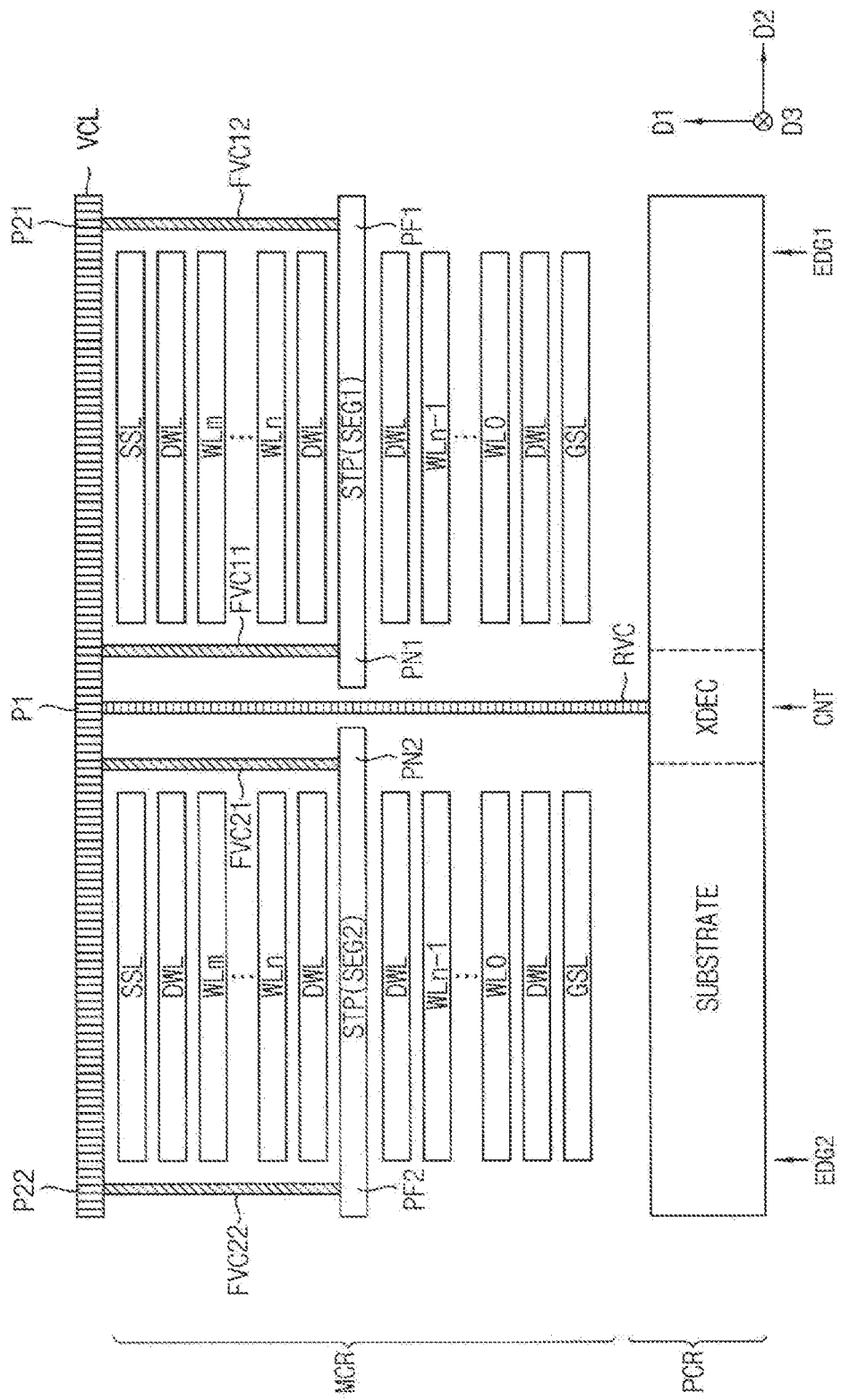
FIGS. 14, 15, and 16 are cross-sectional diagrams illustrating a voltage compensation structure applicable to the windmill structure of FIG. 13 according to exemplary embodiments of the inventive concept.
Figure 15:
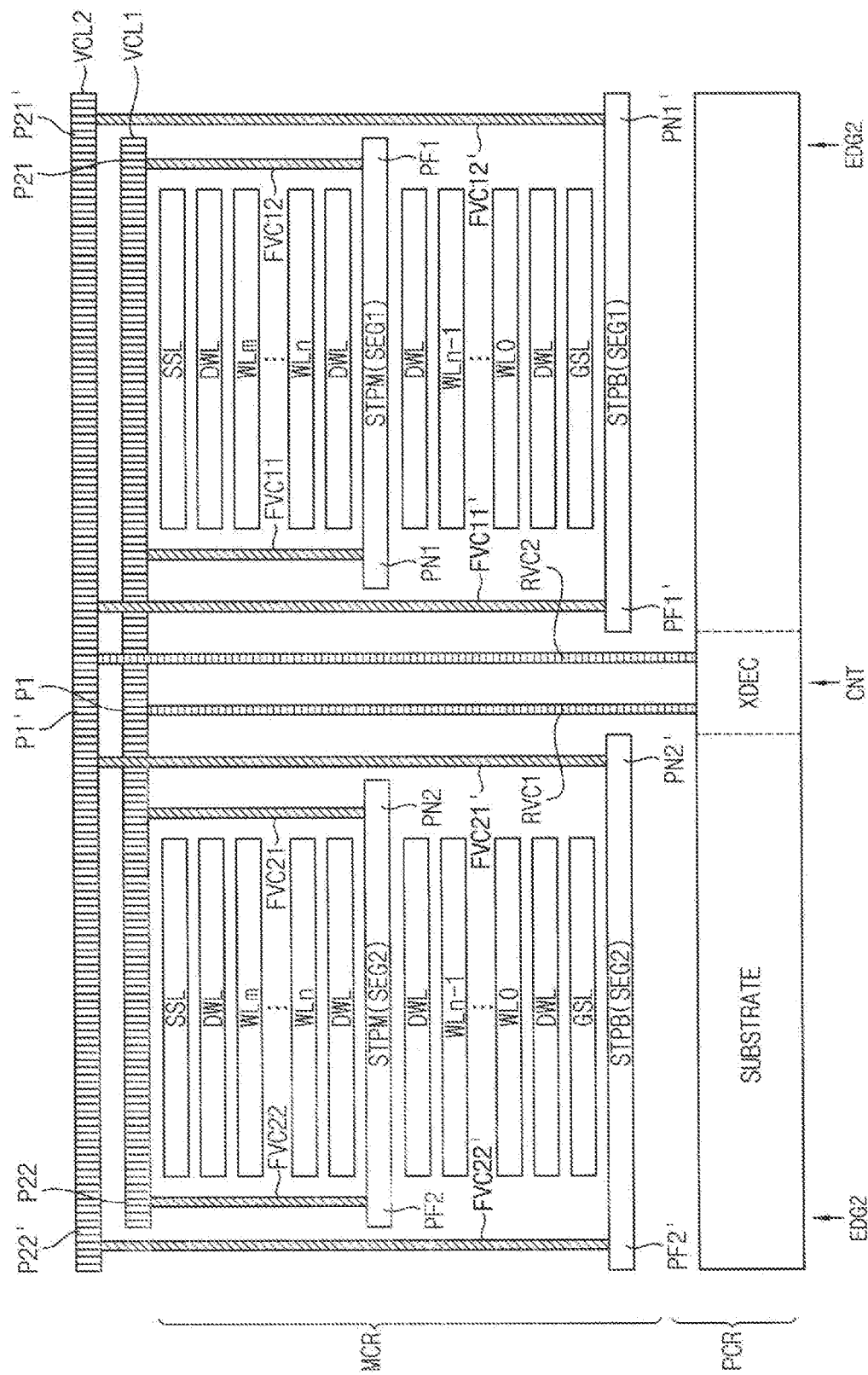
Figure 16:
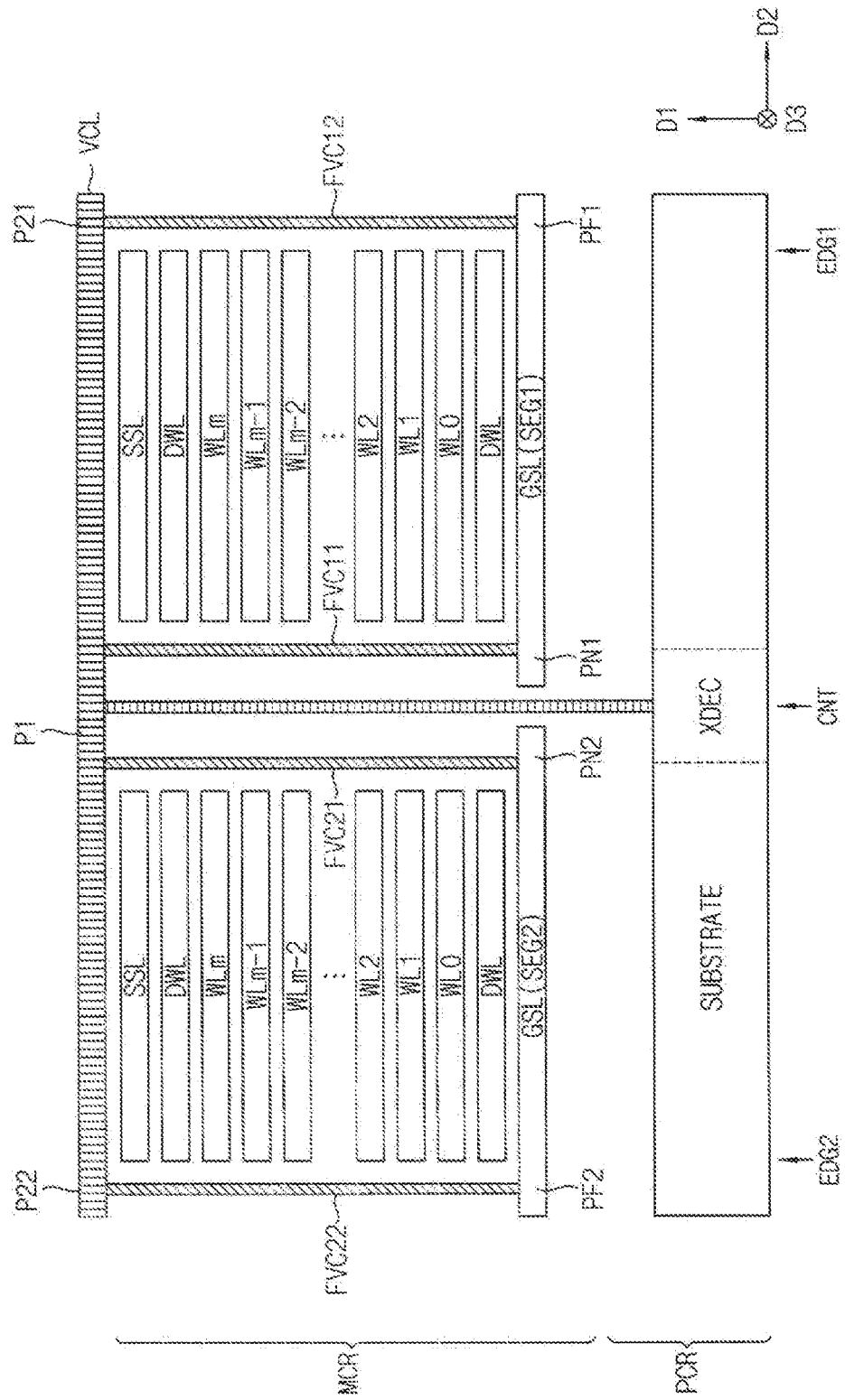

FIGS. 14, 15, and 16 are cross-sectional diagrams illustrating a voltage compensation structure applicable to the windmill structure of FIG. 13 according to exemplary embodiments of the inventive concept.

Referring to FIG. 14, a plurality of gate lines may include the string selection line SSL, the word lines WL0~WLm, the dummy word lines DWL, the stopper line STP, and the ground selection line GSL. Each of the gate lines may be divided into a first segment SEG1 disposed at a right portion in FIG. 14 and a second segment SEG2 disposed at a left portion in FIG. 14.

FIG. 14 illustrates an example where the voltage compensation line VCL is disposed over the plurality of gate lines and the above-described target gate line corresponds to the stopper line STP.

For example, the address decoder XDEC may be disposed in the center portion CNT between the first edge portion EDG1 and the second edge portion EDG2 in the second direction D2 of the memory block. In this case, the first portion P1 of the voltage compensation line VCL and the near end portions PN1 and PN2 of the stopper line STP correspond to the center portion CNT in the vertical direction D1, and the second portions P21 and P21 of the voltage compensation line VCL and the far end portions PF1 and PF2 of the stopper line STP correspond to the first and second edge portions EDG1 and EDG2 in the vertical direction D1.

The voltage compensation structure for transferring the driving voltage from the address decoder XDEC to the stopper line STP corresponding to the target gate line may include the voltage compensation line VCL, the rising vertical contact RVC, the first falling vertical contact FVC11, the second falling vertical contact FVC21, the third falling vertical contact FVC12, and the fourth falling vertical contact FVC22. The other conduction paths for transferring driving voltages to the other gate lines SSL, DWL, WL, and GSL corresponding to the non-target gate lines are omitted in FIG. 14 for convenience of illustration.

The rising vertical contact RVC corresponds to the conduction path 11 in FIG. 1, the first and second falling vertical contacts FVC11 and FVC21 correspond to the near conduction path 12 in FIG. 1, and the third and fourth falling vertical contact FVC12 and FVC22 correspond to the far conduction path 13 in FIG. 1.

The voltage compensation line VCL extends in the row direction D2 substantially in parallel with the plurality of gate lines, and the voltage compensation line VCL overlaps in the vertical direction D1 with the stopper line STP. The rising vertical contact RVC extends in the vertical direction D1 to connect the address decoder XDEC and the first portion P1 of the voltage compensation line VCL. The first falling vertical contact FVC11 connects in the vertical direction D1 the first portion P1 of the voltage compensation line VCL and the near end portion PN1 of the first segment SEG1 of the stopper line STP. The second falling vertical contact FVC21 connects in the vertical direction D1 the first portion P1 of the voltage compensation line VCL and the near end portion PN2 of the second segment SEG2 of the stopper line STP. The third falling vertical contact FVC12 connects in the vertical direction D1 the second portion P21 of the voltage compensation line VCL corresponding to the first edge portion EDG1 and the far end portion PF1 of the first segment SEG1 of the stopper line STP. The fourth falling vertical contact FVC22 connects in the vertical direction D1 the second portion P22 of the voltage compensation line VCL corresponding to the second edge portion EDG2 and the far end portion PF2 of the second segment SEG2 of the stopper line STP.

Referring to FIG. 15, the voltage compensation structure for transferring the driving voltage from the address decoder XDEC to the stopper line STP corresponding to the target gate line may include the first and second voltage compensation lines VCL1 and VCL2, the first and second rising vertical contact RVC1 and RVC2, the first falling vertical contact FVC11, the second falling vertical contact FVC21, the third falling vertical contact FVC12, the fourth falling vertical contact FVC22, a fifth falling vertical contact FVC11', a sixth falling vertical contact FVC21', a seventh falling vertical contact FVC12', and an eighth falling vertical contact FVC22'. The voltage compensation path of the first stopper line STPM using the first voltage compensation line VCL1 is substantially the same as that of FIG. 14. The voltage compensation path of the second stopper line STPB using the second voltage compensation line VCL2 is substantially the same as that of FIG. 14 except that the first through fourth falling vertical contacts FVC11, FVC21, FVC12 and FVC22 are replaced with the fourth through eighth falling vertical contacts FVC11', FVC21', FVC12', and FVC22', the near and far end portions PN1, PN2, PF1 and PF2 are replaced with corresponding portions PN1', PN2', PF1', and PF2', and the first portion P1 and the second portions P21 and P22 are replaced with corresponding portions P1', P21', and P22'.

Referring to FIG. 16, the voltage compensation structure of FIG. 16 is substantially the same as that of FIG. 14 except that the target gate line is changed from the stopper line STP to the ground selection line GSL, and thus repeat descriptions are omitted.

Figure 17:
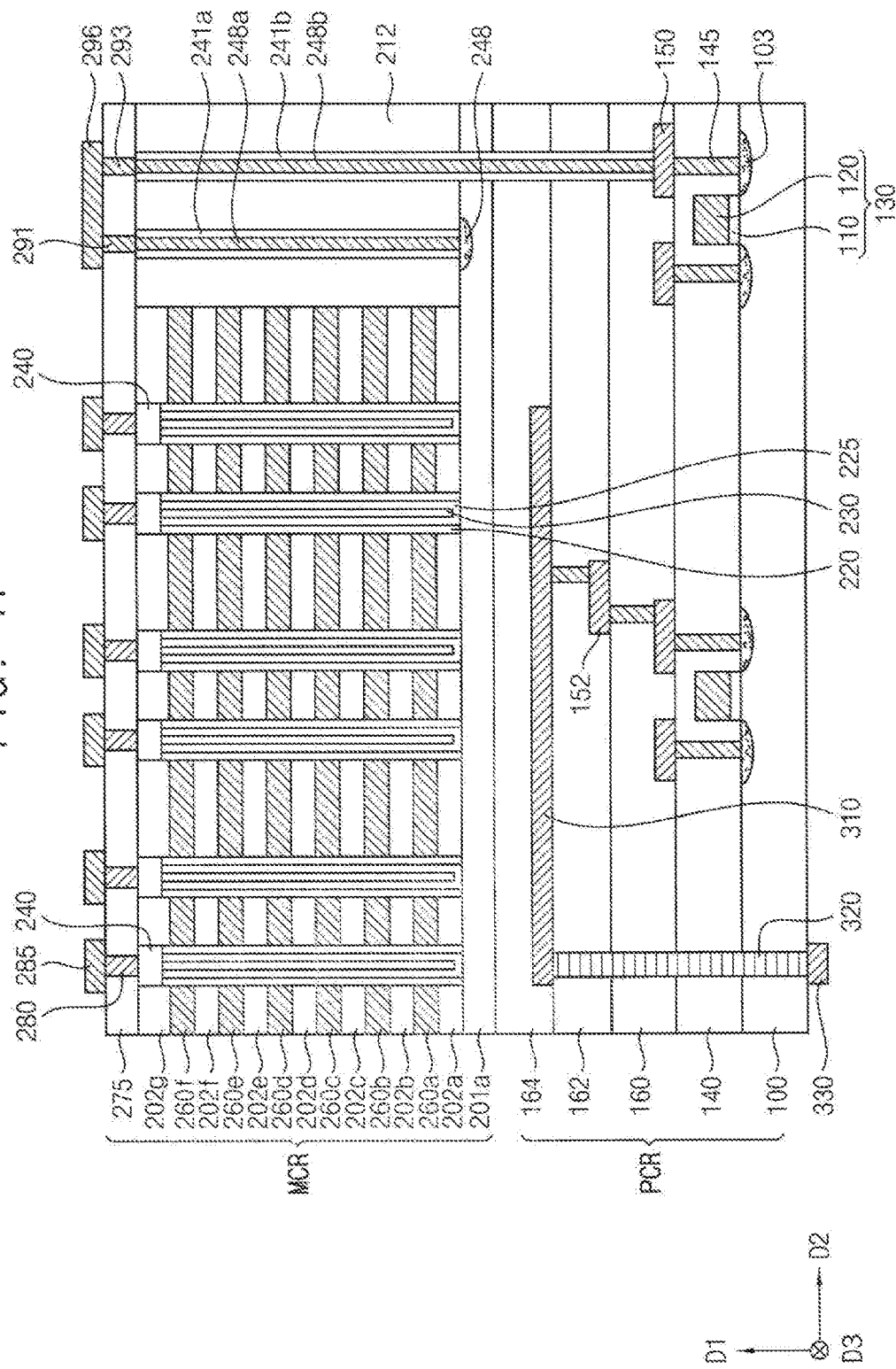
FIG. 17 is a cross-sectional diagram illustrating a nonvolatile memory device according to an exemplary embodiment of the inventive concept.

FIG. 17 is a cross-sectional diagram illustrating a nonvolatile memory device according to an exemplary embodiment of the inventive concept. The memory device of FIG. 17 is similar to that of FIGS. 4 through 6 and repeat descriptions are omitted.

In comparison with the nonvolatile memory device memory device of FIG. 5 that includes one lower wiring layer, the memory device of FIG. 17 includes a plurality of lower wiring layers. For example, the second lower insulation layer 160 may be formed on the first lower insulation layer 140 to cover the lower wiring 150, a third lower insulation layer 162 may be formed on the second lower insulation layer 160 to cover a lower wiring 152, and a fourth lower insulation layer 164 may be formed on the third lower insulation layer 162 to cover the lower wiring 310. FIG. 17 illustrates that the through-substrate via 320 is connected to the lower wiring 310 in the uppermost wiring layer; however, the connection is not limited thereto. For example, the through-substrate via 320 may be connected to the lower wiring in various layers according to the routing of signal lines. Hereinafter, examples where a wiring in the uppermost wiring layer is used as the voltage compensation line VCL are described with reference to FIGS. 18 through 21.

FIGS. 18 through 21 are cross-sectional diagrams illustrating a voltage compensation structure applicable to the nonvolatile memory device of FIG. 17 according to exemplary embodiments of the inventive concept.

The voltage compensation structures of FIGS. 18 through 21 are substantially the same as those of FIGS. 9, 12, 14, and 15, respectively, except that the voltage compensation line VCL is disposed under the plurality of gate lines, and thus repeat descriptions may be omitted. The examples of FIGS. 11 and 15 may also be modified to dispose the voltage compensation line VCL under the plurality of gate lines.

Figure 18:
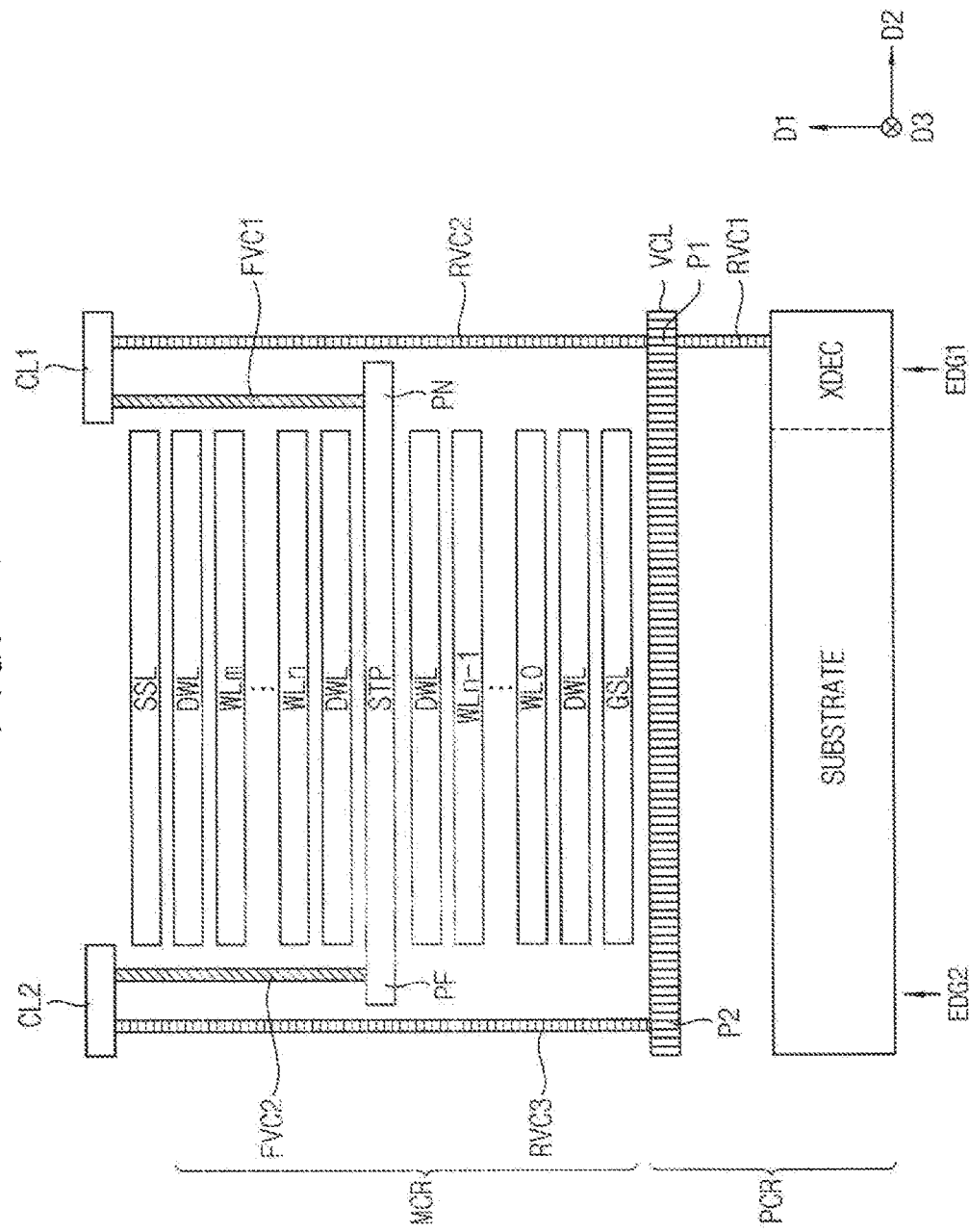
FIGS. 18 through 21 are cross-sectional diagrams illustrating a voltage compensation structure applicable to the nonvolatile memory device of FIG. 17 according to exemplary embodiments of the inventive concept.

Referring to FIG. 18, a first conduction line CL1 and a second conduction line CL2 may be respectively disposed in the first edge portion EDG1 and the second edge portion EDG2 over the plurality of gate lines SSL, WL0~WLm, DWL, STP, and GSL. The first rising vertical contact RVC1 connects the address decoder XDEC and the first portion P1 of the voltage compensation line VCL. The second rising vertical contact RVC2 connects the first portion P1 of the voltage compensation line VCL and the first conduction line CL1. A third rising vertical contact RVC3 connects the second portion P2 of the voltage compensation line VCL and the second conduction line CL2. The first falling vertical contact FVC1 connects the first conduction line CL1 and the near end portion PN of the stopper line STP corresponding to the target gate line. The second falling vertical contact FVC2 connects the second conduction line CL2 and the far end portion PF of the stopper line STP.

Figure 19:
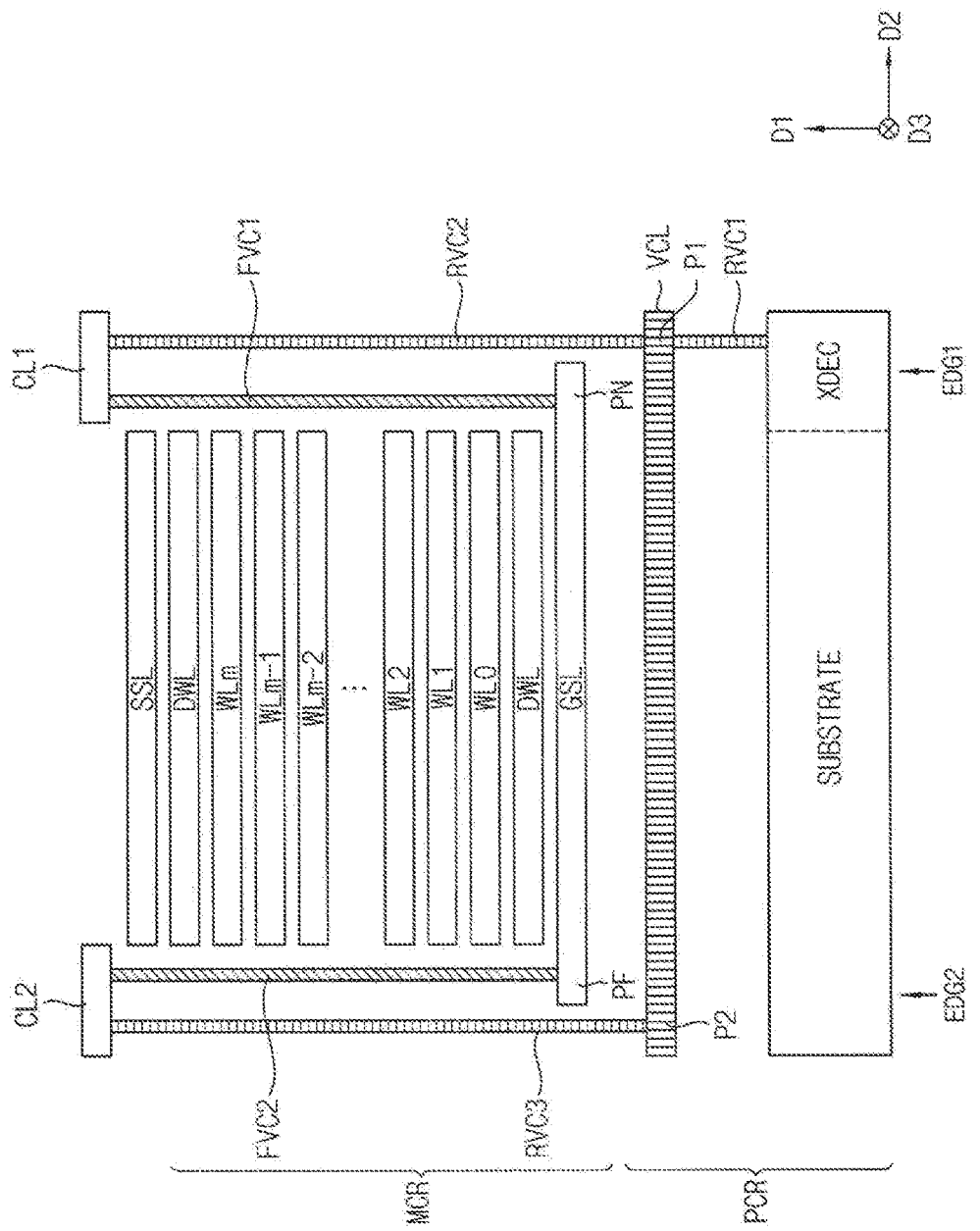

The voltage compensation structure of FIG. 19 is substantially the same as that of FIG. 18 except that the target gate line is changed from the stopper line STP to the ground selection line GSL, and thus repeat descriptions are omitted.

Figure 20:
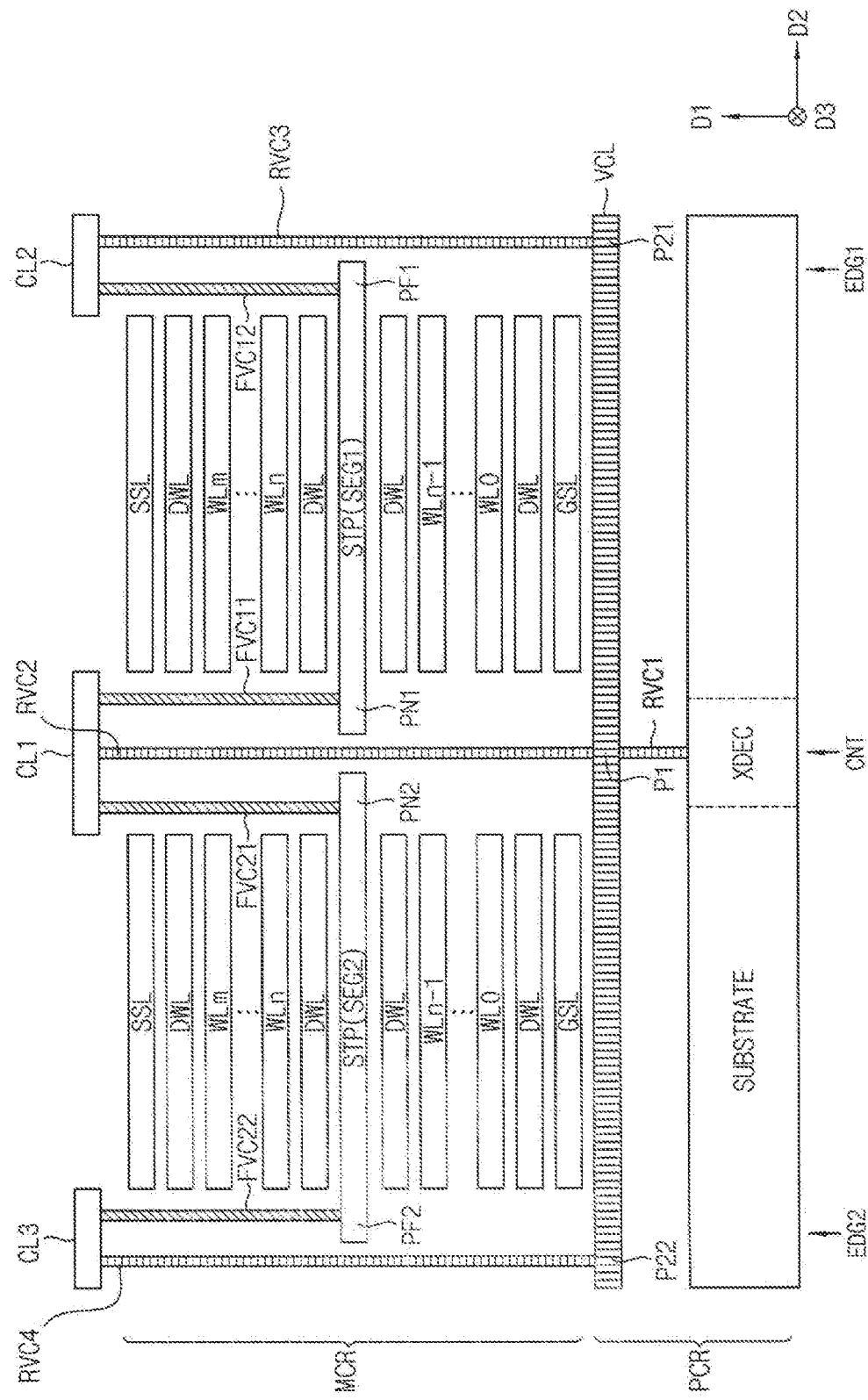

Referring to FIG. 20, the first conduction line CL1, the second conduction line CL2, and a third conduction line CL3 may be respectively disposed in the center portion CNT, the first edge portion EDG1, and the second edge portion EDG2 over the plurality of gate lines SSL, WL0~WLm, DWL, STP, and GSL. The first rising vertical contact RVC1 connects the address decoder XDEC and the first portion P1 of the voltage compensation line VCL. The second rising vertical contact RVC2 connects the first portion P1 of the voltage compensation line VCL and the first conduction line CL1. The third rising vertical contact RVC3 connects the second portion P21 of the voltage compensation line VCL corresponding to the first edge portion EDG1 and the second conduction line CL2. A fourth rising vertical contact RVC4 connects the second portion P22 of the voltage compensation line VCL corresponding to the second edge portion EDG2 and the third conduction line CL3. The first falling vertical contact FVC11 connects the first conduction line CL1 and the near end portion PN1 of the first segment SEG1 of the stopper line STP corresponding to the target gate line. The second falling vertical contact FVC21 connects the first conduction line CL1 and the near end portion PN2 of the second segment SEG2 of the stopper line STP. The third falling vertical contact FVC12 connects the second conduction line CL2 and the far end portion PF1 of the first segment SEG1 of the stopper line STP. The fourth falling vertical contact FVC22 connects the third conduction line CL3 and the far end portion PF2 of the second segment SEG2 of the stopper line STP.

Figure 21:
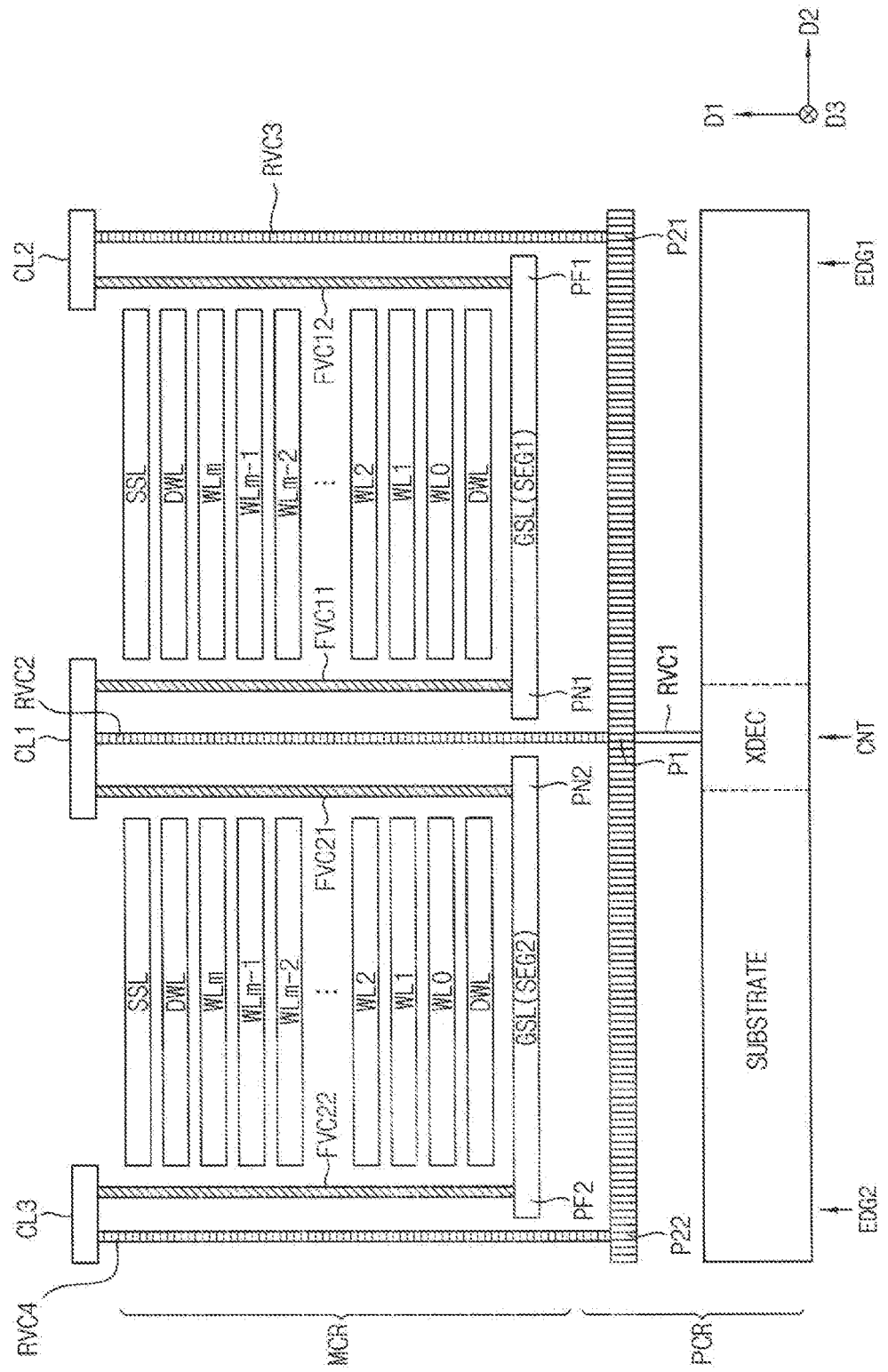

The voltage compensation structure of FIG. 21 is substantially the same as that of FIG. 20 except that the target gate line is changed from the stopper line STP to the ground selection line GSL, and thus repeat descriptions are omitted.

Figure 22:
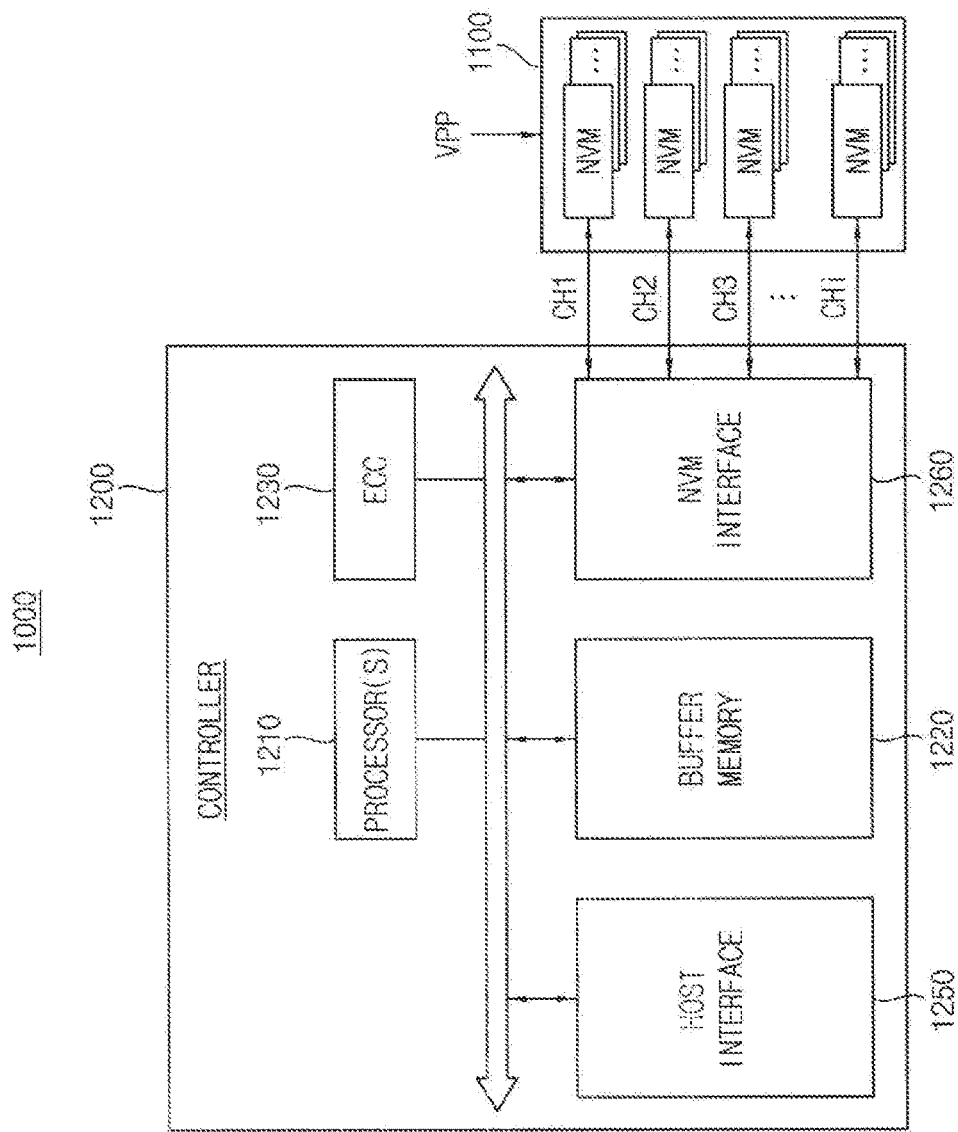
FIG. 22 is a block diagram illustrating a solid state disk or solid state drive (SSD) according to an exemplary embodiment of the inventive concept.

FIG. 22 is a block diagram illustrating a solid state disk or solid state drive (SSD) according to an exemplary embodiment of the inventive concept.

Referring to FIG. 22, an SSD 1000 includes multiple nonvolatile memory devices 1100 and an SSD controller 1200.

The nonvolatile memory devices 1100 may be configured optionally to receive a high voltage VPP. The nonvolatile memory devices 1100 may correspond to the above-described memory devices according to exemplary embodiments of the inventive concept. Thus, the nonvolatile memory devices 1100 may include the voltage compensation structure to compensate for the voltage drop of the target gate line having a relatively large resistance.

The SSD controller 1200 is connected to the nonvolatile memory devices 1100 through multiple channels CH1 to CHi. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, the ECC circuit 1230 corrects an error of data recovered from the nonvolatile memory devices 1100.

As described above, the nonvolatile memory device according to exemplary embodiments of the inventive concept may enhance performance of the nonvolatile memory device and the system including the nonvolatile memory device by compensating for the voltage drop of the target gate line having a relatively higher resistance using the voltage compensation line having a relatively lower resistance to reduce deviations of driving voltages between gate lines.

The inventive concept may be applied to any electronic devices and systems having a processor-in-memory (PIM) for encrypted data. For example, the inventive concept may be applied to systems such as a memory card, a solid state drive (SSD), an embedded multimedia card (eMMC), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

While the inventive concept has been shown and described with reference to exemplary embodiments thereof, it will be apparent to those of ordinary skill in the art that various modifications in form and details may be made thereto without materially departing from the spirit and scope of the inventive concept as set forth by the following claims.

What is claimed is:

1. A nonvolatile memory device comprising:
   a plurality of gate lines extending in a first direction and stacked in a second direction to form a memory block, wherein the second direction is perpendicular to the first direction;
   an address decoder disposed at a first side of the plurality of gate lines to drive the plurality of gate lines;
   a voltage compensation line extending in the first direction substantially in parallel with the plurality of gate lines, and overlapping with a target gate line among the plurality of gate lines in the second direction;
   a rising vertical contact extending in the second direction to connect the address decoder and a first portion of the voltage compensation line;
   a near conduction path connecting in the second direction the first portion of the voltage compensation line and a near end portion of the target gate line; and
   a far conduction path connecting in the second direction a second portion of the voltage compensation line and a far end portion of the target gate line.

2. The nonvolatile memory device of claim 1, wherein the target gate line is formed of material different from other gate lines of the plurality of gate lines.

3. The nonvolatile memory device of claim 2, wherein the target gate line is formed of polysilicon and the other gate lines are formed of metal.

4. The nonvolatile memory device of claim 1, wherein resistance of the target gate line is larger than resistance of other gate lines of the plurality gate lines.

5. The nonvolatile memory device of claim 1, wherein a resistance value of a conduction path from the first portion of the voltage compensation line to the far end portion of the target gate line via the voltage compensation line is smaller than a resistance value of a conduction path from the first portion of the voltage compensation line to the far end portion of the target gate line via the target gate line.

6. The nonvolatile memory device of claim 1, wherein the address decoder is disposed at a first edge portion with respect to the memory block,
   the first portion of the voltage compensation line and the near end portion of the target gate line correspond to the first edge portion in the second direction,
   the second portion of the voltage compensation line and the far end portion of the target gate line corresponds to a second edge portion with respect to the memory block in the second direction, and
   the first edge portion and the second edge portion are opposite to each other in the first direction.

7. The nonvolatile memory device of claim 6, wherein the voltage compensation line is disposed at a second side of the plurality of gate lines, and
   the second side and the first side are opposite to each other in the second direction.

8. The nonvolatile memory device of claim 7, wherein the near conduction path includes:
   a first falling vertical contact connecting the first portion of the voltage compensation line and the near end portion of the target gate line, and
   wherein the far conduction path includes:
   a second falling vertical contact connecting the second portion of the voltage compensation line and the far end portion of the target gate line.

9. The nonvolatile memory device of claim 6, wherein the voltage compensation line is disposed at the first side of the plurality of gate lines.

10. The nonvolatile memory device of claim 9, further comprising:
    a first conduction line disposed at the first edge portion and at a second side of the plurality of gate lines, wherein the second side and the first side are opposite to each other in the second direction; and
    a second conduction line disposed at the second edge portion and at the second side of the plurality of gate lines,
    wherein the rising vertical contact includes:
       a first rising vertical contact connecting the first portion of the voltage compensation line and the address decoder;
       a second rising vertical contact connecting the first portion of the voltage compensation line and the first conduction line; and
       a third rising vertical contact connecting the second portion of the voltage compensation line and the second conduction line, and
    wherein the near conduction path includes:
       a first falling vertical contact connecting the first conduction line and the near end portion of the target gate line, and
    wherein the far conduction path includes:
       a second falling vertical contact connecting the second conduction line and the far end portion of the target gate line.

11. The nonvolatile memory device of claim 1, wherein the address decoder is disposed at a center portion between a first edge portion and a second edge portion in the first direction of the memory block,
    the first portion of the voltage compensation line and the near end portion of the target gate line corresponds to the center portion in the second direction, and
    the second portion of the voltage compensation line and the far end portion of the target gate line correspond to the first edge portion and the second edge portion in the second direction.

12. The nonvolatile memory device of claim 11, wherein the voltage compensation line is disposed at a second side of the plurality of gate lines, and
    the second side and the first side are opposite to each other in the second direction.

13. The nonvolatile memory device of claim 12, wherein the near conduction path includes:
    a first falling vertical contact connecting the first portion of the voltage compensation line and a first near end portion of a first segment of the target gate line; and
    a second falling vertical contact connecting the first portion of the voltage compensation line and a second near end portion of a second segment of the target gate line, and
    wherein the far conduction path includes:
    a third falling vertical contact connecting the second portion of the voltage compensation line corresponding to the first edge portion and a first far end portion of the first segment of the target gate line; and
    a fourth falling vertical contact connecting the second portion of the voltage compensation line corresponding to the second edge portion and a second far end portion of the second segment of the target gate line.

14. The nonvolatile memory device of claim 11, wherein the voltage compensation line is disposed at the first side of the plurality of gate lines.

15. The nonvolatile memory device of claim 14, further comprising:

a first conduction line disposed at the center portion and at a second side of the plurality of gate lines, wherein the second side and the first side are opposite to each other in the second direction;

a second conduction line disposed at the first edge portion and at the second side of the plurality of gate lines; and a third conduction line disposed at the second edge portion and at the second side of the plurality of gate lines, wherein the rising vertical contact includes:

a first rising vertical contact connecting the first portion of the voltage compensation line and the address decoder;

a second rising vertical contact connecting the first portion of the voltage compensation line and the first conduction line;

a third rising vertical contact connecting the second portion of the voltage compensation line corresponding to the first edge portion and the second conduction line; and a fourth rising vertical contact connecting the second portion of the voltage compensation line corresponding to the second edge portion and the third conduction line, and wherein the near conduction path includes:

a first falling vertical contact connecting the first conduction line and a first near end portion of a first segment of the target gate line; and a second falling vertical contact connecting the first conduction line and a second near end portion of a second segment of the target gate line, and wherein the far conduction path includes:

a third falling vertical contact connecting the second conduction line and a first far end portion of the first segment of the target gate line; and a fourth falling vertical contact connecting the third conduction line and a second far end portion of the second segment of the target gate line.

16. The nonvolatile memory device of claim 1, wherein the target gate line corresponds to a stopper line that is disposed at a center portion of the plurality of gate lines.

17. The nonvolatile memory device of claim 1, wherein the target gate line corresponds to a ground selection line that is disposed at a lowest portion of the plurality of gate lines, and the lowest portion is adjacent to the first side of the plurality of gate lines.

18. The nonvolatile memory device of claim 1, wherein the target gate line includes:

a first stopper line that is disposed at a center portion of the plurality of gate lines; and a second stopper line that is dispose at a lowest portion of the plurality of gate lines, wherein the lowest portion is adjacent to the first side of the plurality of gate lines, and wherein the voltage compensation line includes:

a first voltage compensation line to compensate for a driving voltage of the first stopper line; and a second voltage compensation line to compensate for a driving voltage of the second stopper line.

19. A nonvolatile memory device comprising:

a plurality of gate lines extending in a first direction and stacked in a second direction to form a memory block, wherein the second direction is perpendicular to the first direction;

a voltage compensation line to compensate for a driving voltage applied to a target gate line among the plurality of gate lines; and a plurality of conduction paths connecting the voltage compensation line and end portions of the target gate line in the second direction.

20. A nonvolatile memory device comprising:

a plurality of gate lines extending in a first direction and stacked in a second direction to form a memory block, wherein the second direction is perpendicular to the first direction;

a first voltage compensation line to compensate for a driving voltage applied to a first target gate line among the plurality of gate lines;

a second voltage compensation line to compensate for a driving voltage applied to a second target gate line among the plurality of gate lines;

a plurality of first conduction paths connecting the first voltage compensation line and end portions of the first target gate line in the second direction; and a plurality of second conduction paths connecting the second voltage compensation line and end portions of the second target gate line in the second direction.

* * * * *